US012580527B2

(12) United States Patent　　　　(10) Patent No.:　US 12,580,527 B2

Goli et al.　　　　　　　　　　　　(45) Date of Patent:　Mar. 17, 2026

(54) REDUCING SAMPLED AZ NOISE AND SAMPLED RESET NOISE IN SWITCHED CAPACITOR AMPLIFIERS

(71) Applicant: TEXAS INSTRUMENTS INCORPORATED, Dallas, TX (US)

(72) Inventors: Sravana Kumar Goli, Bangalore (IN); Nagesh Surendranath, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 687 days.

(21) Appl. No.: 17/899,338

(22) Filed: Aug. 30, 2022

(65) Prior Publication Data

US 2024/0072738 A1　　Feb. 29, 2024

(51) Int. Cl.
　　*H03F 3/00*　　　(2006.01)
　　*H03F 3/45*　　　(2006.01)

(52) U.S. Cl.
　　CPC ......... *H03F 3/005* (2013.01); *H03F 3/45475* (2013.01)

(58) Field of Classification Search
　　CPC .. H03F 3/005; H03F 3/45475; H03F 3/45968; H03F 2203/45138; H03F 2203/45212; H03F 2203/45512; H03F 2203/45514
　　USPC ........................ 330/9, 51; 327/124, 307, 554
　　See application file for complete search history.

(56) References Cited

U.S. PATENT DOCUMENTS

2009/0128391 A1 *　5/2009　Bailey ................... H03M 1/168
　　　　　　　　　　　　　　　　　　　　　341/172
2016/0100116 A1 *　4/2016　Mesgarini ............ H04N 25/709
　　　　　　　　　　　　　　　　　　　　　348/300
2018/0076780 A1 *　3/2018　Wang ................. H03F 3/45071

OTHER PUBLICATIONS

Texas Instruments, "AFE2256 256 Channel, Analog Front-End for Digital X-Ray, Flat Panel Detectors", May 2016, 7 pgs.

* cited by examiner

*Primary Examiner* — Andrea Lindgren Baltzell
*Assistant Examiner* — Nareh Shamiryan
(74) *Attorney, Agent, or Firm* — Xianghui Huang; Frank D. Cimino

(57) ABSTRACT

In at least one example, a circuit includes an amplifier, a first feedback loop, and a second feedback loop. The amplifier includes an amplifier input and an amplifier output. The first feedback loop includes a first feedback capacitor and a first switch. The first feedback loop is coupled between the amplifier input and the amplifier output. The first feedback capacitor is coupled to the amplifier output through the first switch. The second feedback loop includes a second feedback capacitor and a second switch. The second feedback loop is coupled in parallel with the first feedback loop between the amplifier input and the amplifier output. The second feedback capacitor is coupled to the amplifier input and to the first feedback capacitor through the second switch.

21 Claims, 7 Drawing Sheets

FIG. 2

REDUCING SAMPLED AZ NOISE AND SAMPLED RESET NOISE IN SWITCHED CAPACITOR AMPLIFIERS

BACKGROUND

Sampling circuits can be useful in various applications that involve processing signals provided by sensors. For example, sampling circuits can compose read out integrated circuits (ROICs) with single or multiple channel inputs. Each channel input among the multiple channel inputs can receive a signal provided at a sensor output of a sensor, process the signal, and provide a digital representation of the signal as an output. Noise from various sources can reduce an accuracy of the digital representation provided at the output of the sampling circuit. Accordingly, reducing noise can be useful to increase the accuracy of the digital representation provided at the output of the sampling circuit.

SUMMARY

In at least one example, a circuit includes an amplifier, a first feedback loop, and a second feedback loop. The amplifier includes an amplifier input and an amplifier output. The first feedback loop includes a first feedback capacitor and a first switch. The first feedback loop is coupled between the amplifier input and the amplifier output. The first feedback capacitor is coupled to the amplifier output through the first switch. The second feedback loop includes a second feedback capacitor and a second switch. The second feedback loop is coupled in parallel with the first feedback loop between the amplifier input and the amplifier output. The second feedback capacitor is coupled to the amplifier input and to the first feedback capacitor through the second switch.

BRIEF DESCRIPTION OF THE DRAWINGS

FIG. 2 is a diagram of example waveforms versus time for a circuit for sampling signals.

The same reference numbers or other reference designators are used in the drawings to designate the same or similar (functionally and/or structurally) features.

DETAILED DESCRIPTION

Figure 1:
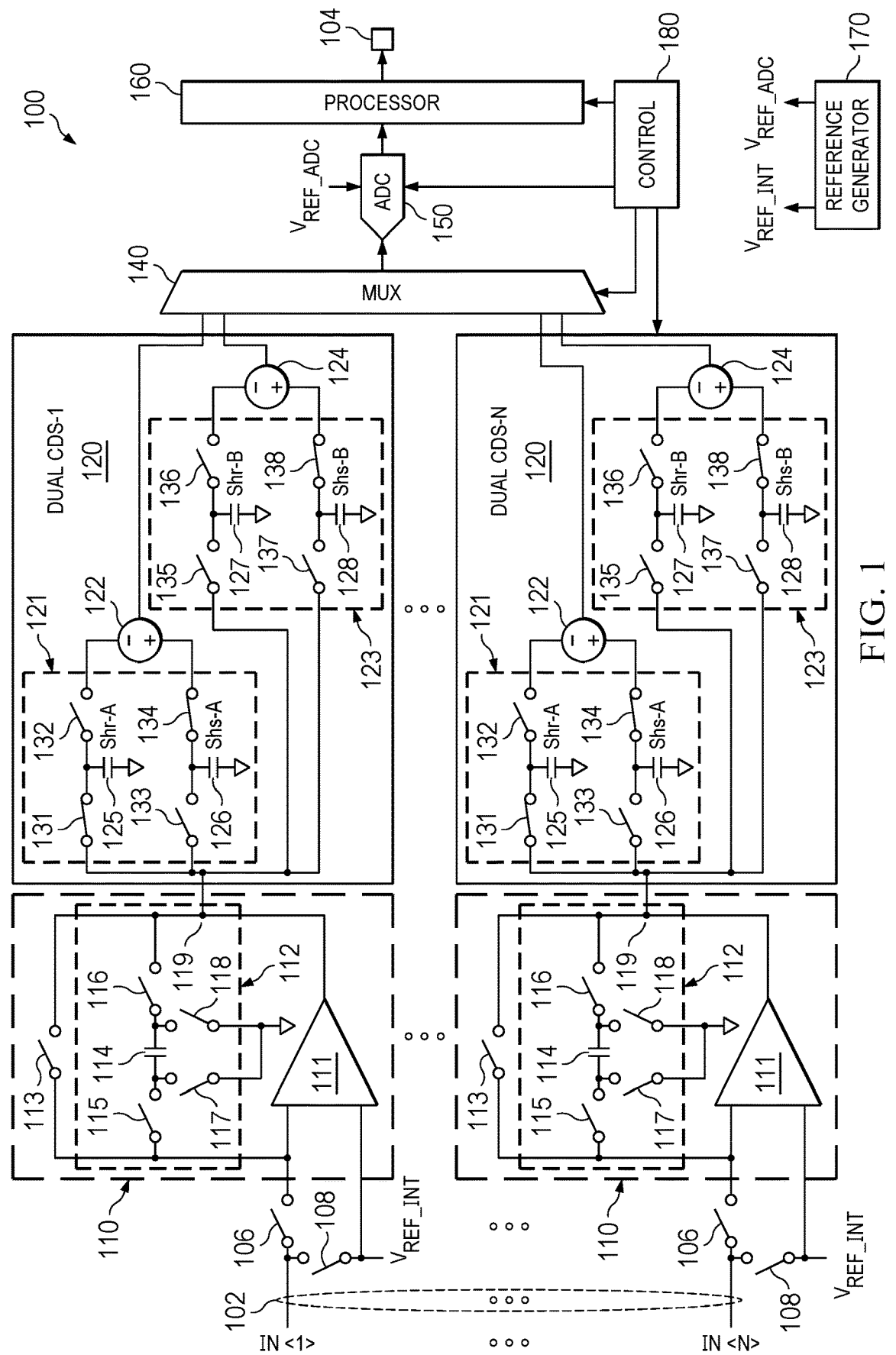
FIG. 1 is a block diagram of an example circuit for sampling signals.

As described above, noise contributed by various sources can reduce an accuracy of a digital representation of a sensor signal provided at an output of a sampling circuit. Sources of noise can include sources external to a read out integrated circuit (ROIC) (such as those used in X-ray systems or other medical or industrial systems) and sources internal to the ROIC. Noise contributed by sources internal to the ROIC can include front end noise and back end noise. Front end noise can include noise that is contributed by components forming a front end of an ROIC such as an integrator. Back end noise can include noise that is contributed by components forming a back end of an ROIC, such as components involved in analog-to-digital conversion.

Averaging digital representations by reading out from an ROIC multiple times can be useful to reduce some signal chain noise. Averaging is generally ineffective in reducing signal chain noise that is random with non-deterministic values such as sampled noise. Sampling noise can generally be reduced by increasing capacitance (e.g., increasing feedback capacitance in the integrator) or increasing front end gain (e.g., increasing a supply voltage of the integrator) of the sampling circuit. However, reducing sampling noise through increasing capacitance or front end gain can come at the cost of increased circuit area and increased power consumption by the sampling circuit.

Aspects of this description relate to reducing sampling noise in a circuit. In at least one example, the circuit includes a second feedback loop coupled in parallel with a first feedback loop of an amplifier. The second feedback loop can represent an additional feedback loop for the amplifier that can be coupled to the first feedback loop in the dummy phase and can be decoupled from the first feedback loop in the hold phase. The second feedback loop can be useful to implement a dummy phase that intervenes between an auto-zero (AZ) phase and a hold phase. The second feedback loop can include a feedback capacitor. The feedback capacitor in the second feedback loop can provide sampling noise-related charge to capacitance of the first feedback loop during the dummy phase. Providing the sampling noise-related charge to the capacitance of the first feedback loop during the dummy phase can be useful to reduce sampling noise-related charge provided by the capacitance of the first feedback loop during a subsequent hold phase. Providing the sampling noise-related charge to the capacitance of the first feedback loop during the dummy phase can also be useful to reduce sampling noise gain in the subsequent hold phase. The feedback capacitor of the second feedback loop can have a capacitance that is less than the capacitance of the first feedback loop. The feedback capacitor of the second feedback loop can also have a capacitance that is less than a parasitic capacitance of the amplifier. Accordingly, the second feedback loop can provide reduced sampling noise without incurring the cost of increased circuit area or increased power consumption by the sampling circuit.

FIG. 1 is a block diagram of an example circuit 100 for sampling signals. The circuit 100 has an input 102 and an output 104. The input 102 can include multiple channel inputs. FIG. 1 shows the input 102 as including N channel inputs, where N is an integer (e.g., 2, 256, and 512) greater than one. Each channel input (e.g., channel input N) of the input 102 can be adapted to be coupled to a sensor output of a sensor. Accordingly, the input 102 of the circuit 100 can be adapted to be coupled to a set of N sensors. Sensor generally refers to a device that provides a signal (e.g., current, charge, or voltage) at a sensor output responsive to detecting a stimulus (e.g., physical, chemical, electrical or biological stimuli). A sensor signal can refer to a signal provided at a sensor output responsive to detecting a stimulus. For example, the set of sensors can include a photodiode sensor of an x-ray system that can provide a sensor signal (e.g., current, charge, or voltage) responsive to detecting incident radiation from an x-ray source. In this example, a level of the sensor signal can correspond to a level of the incident radiation that the photodiode sensor detects. A sensor signal provided at a sensor output of a sensor can be provided to a particular channel input (e.g., channel input N) of the input 102 coupled to the sensor output. The circuit 100 is configured to provide, responsive to the sensor signal provided at the particular channel input of the input 102, a digital representation of the sensor signal at the output 104.

For each channel input of the input 102, the circuit 100 can include a sensor switch 106, a switch 108, and an integrator 110. The integrator 110 can include an amplifier 111, a feedback circuit 112 and a reset switch 113. The feedback circuit 112 can include a feedback capacitor 114 and may also include switches 115, 116, 117, and 118. FIG. 1 shows the integrator 110 as including one feedback circuit (e.g., the feedback circuit 112). In other examples, the integrator 110 can include multiple feedback circuits. For example, the integrator 110 can include multiple feedback capacitors that can be similar or substantially similar to the feedback capacitor 114.

For each channel input of the input 102, the circuit 100 can also include a correlated double sampler (CDS) 120 coupled to an integrator output 119 of the integrator 110. The CDS 120 can include a first bank (bank-A) 121, a first subtractor 122, a second bank (bank-B) 123, and a second subtractor 124. Bank-A 121 can include a first sample capacitor 125 and a second sample capacitor 126. Bank-B 123 can include a third sample capacitor 127 and a fourth sample capacitor 128. Bank-A 121 can also include switches 131, 132, 133, and 134. Bank-B 123 can also include switches 135, 136, 137, and 138. The circuit 100 can also include a multiplexer 140, an analog-to-digital converter (ADC) block 150, a processor 160, a reference generator 170, and a controller 180. The processor 160 can be configured to perform signal processing operations on digital representations of sensor signals provided at an ADC output of the ADC block 150. The reference generator 170 can be configured to provide reference voltage (e.g., $V_{REF\_INT}$) to the integrator 110 and reference voltage (e.g., $V_{REF\_ADC}$) to the ADC block 150.

In an example architecture of the circuit 100, a channel input (e.g., channel input N) of the input 102 can be coupled between a first terminal of the sensor switch 106 and a sensor (not shown) such as a photodiode. A second terminal of the sensor switch 106 can be coupled to a first amplifier input of the amplifier 111. A first terminal of the switch 108 can be coupled between the input 102 and the first terminal of the sensor switch 106. A second terminal of the switch 108 can be coupled to a second amplifier input of the amplifier 111. A first terminal of the reset switch 113 can be coupled between the second terminal of the sensor switch 106 and the first amplifier input of the amplifier 111. The integrator output 119 can be coupled between a second terminal of the reset switch 113 and an amplifier output of the amplifier 111. A first terminal of the feedback capacitor 114 can be coupled to the first amplifier input of the amplifier 111 through the switch 115. A second terminal of the feedback capacitor 114 can be coupled to the integrator output 119 through the switch 116. A first terminal of the switch 117 can be coupled between the switch 115 and the first terminal of the feedback capacitor 114. A second terminal of the switch 117 can be coupled to a reference voltage (e.g., a common mode input voltage of the amplifier 111). A first terminal of the switch 118 can be coupled between the second terminal of the feedback capacitor 114 and the switch 116. A second terminal of the switch 118 can be coupled to a reference voltage (e.g., a common mode output voltage of the amplifier 111).

A first terminal of the first sample capacitor 125 can be coupled to the integrator output 119 through the switch 131.

The first terminal of the first sample capacitor 125 can also be coupled to a first subtractor input (e.g., an inverting input) of the first subtractor 122 through the switch 132. A first terminal of the second sample capacitor 126 can be coupled to the integrator output 119 through the switch 133. The first terminal of the second sample capacitor 126 can also be coupled to a second subtractor input (e.g., a non-inverting input) of the first subtractor 122 through the switch 134. A first terminal of the third sample capacitor 127 can be coupled to the integrator output 119 through the switch 135. The first terminal of the third sample capacitor 127 can also be coupled to a first subtractor input (e.g., an inverting input) of the second subtractor 124 through the switch 136. A first terminal of the fourth sample capacitor 128 can be coupled to the integrator output 119 through the switch 137. The first terminal of the fourth sample capacitor 128 can also be coupled to a second subtractor input (e.g., a non-inverting input) of the second subtractor 124 through the switch 138. A common potential (e.g., ground terminal) can be coupled to a second terminal of the first sample capacitor 125, a second terminal of the second sample capacitor 126, a second terminal of the third sample capacitor 127, and a second terminal of the fourth sample capacitor 128. A subtractor output of the first subtractor 122 can be coupled to an input of the ADC block 150 through the multiplexer 140. A subtractor output of the second subtractor 124 can be coupled to the input of the ADC block 150 through the multiplexer 140. An output of the ADC block 150 can be coupled to the output 104 through the processor 160.

The circuit 100 includes multiple signal chains between the input 102 and the output 104. As described above, a sensor signal at a sensor output of a sensor can be provided to a particular channel input (e.g., channel input N) of the input 102 that is coupled to the sensor output. The circuit 100 can be configured to provide, responsive to the sensor signal provided at the particular channel input of the input 102, a digital representation of the sensor signal at the output 104. A signal chain can represent a path of the sensor signal from the particular channel input of the input 102 to the output 104. A signal chain of the circuit 100 can include a front end and a back end that is coupled to the front end through the multiplexer 140. For example, a front end of a signal chain can include components (e.g., the integrator 110 and the CDS 120) coupled between a particular channel input (e.g., channel input N) of the input 102 and the multiplexer 140. In this example, a back end of the signal chain can include components (e.g., the ADC block 150 and the processor 160) coupled between the multiplexer 140 and output 104.

FIG. 1 shows each channel input of the input 102 being coupled to the output 104 through one multiplexer (e.g., the multiplexer 140) and one ADC block (e.g., ADC block 150). In other examples, the circuit 100 can include a different number of multiplexers and/or a different number of ADC blocks. For example, the input 102 can include 256 channel inputs. In this example, the circuit 100 can include a first multiplexer, a second multiplexer, a first ADC block, and a second ADC block. The first multiplexer can be coupled between a first subset (e.g., channel input 0 through channel input-127) of the 256 channel inputs and the first ADC block. The second multiplexer can be coupled between a second subset (e.g., channel input-128 through channel input-255) of the 256 channel inputs and the second ADC block. In at least one example, a number (e.g., 3) of multiplexers in the circuit 100 can be different from a number (e.g., 4) of ADC blocks in the circuit 100.

In an example operation, the circuit 100 can be configured to operate in a sampling phase and a conversion phase. Operating the circuit 100 in the sampling phase can be useful to provide the circuit 100 with samples of sensor signals provided at the input 102. Operating the circuit 100 in the conversion phase can be useful to convert samples of sensor signals provided at the input 102 in the sampling phase into digital representations of the sensor signals at the output 104. As described above, the CDS 120 can include two banks: bank-A 121 and bank-B 123. Bank-A 121 and bank-B 123 of the CDS 120 can operate in a complementary manner such that one bank of the CDS 120 operates in the conversion phase while the other bank of the CDS 120 operates in the sampling phase. For example, bank-A 121 can operate in the conversion phase while bank-B 123 operates in the sampling phase. A bank select signal (SEL_BANK) provided by the controller 180 can be useful to operate bank-A 121 and bank-B 123 of the CDS 120 in the complementary manner, as described below. For example, the controller 180 can provide SEL_BANK having an asserted value (e.g., a high-voltage level) to operate bank-A 121 in the sampling phase and to operate bank-B 123 in the conversion phase. Another example, the controller 180 can provide SEL-_BANK having a deasserted value (e.g., a low-voltage level) to operate bank-B 123 in the sampling phase and to operate bank-A 121 in the conversion phase.

The sampling phase can include a reset phase, an offset phase, and a signal phase. In the reset phase, the reset switch 113 along with the switch 117 and the switch 118 of the integrator 110 can be closed (e.g., conducting) using a reset signal (IRST) provided by the controller 180. For example, the controller 180 can provide IRST having an asserted value (e.g., a high-voltage level) to close the reset switch 113 along with the switch 117 and the switch 118 of the integrator 110. Other switches (e.g., the switch 115 and the switch 116 of the integrator 110; switches 131-138 of the CDS 120; the sensor switch 106; and the switch 108) of the circuit 100 can be open (e.g., non-conducting) in the reset phase. Operating the circuit 100 in the reset phase can be useful to reset the feedback capacitor 114 and to discharge signal charge stored in the feedback capacitor 114. In at least one example, resetting the feedback capacitor 114 in the reset phase can introduce reset phase noise in the circuit 100.

In the offset phase, the reset switch 113 along with the switch 117 and the switch 118 of the integrator 110 can be opened using IRST provided by the controller 180. For example, the controller 180 can provide IRST having a deasserted value (e.g., a low-voltage level) to open the reset switch 113 along with the switch 117 and the switch 118 of the integrator 110. The switch 115 and the switch 116 of the integrator 110 can also be closed in the offset phase using an inverse of the reset signal ($\overline{IRST}$) provided by the controller 180. For example, the controller 180 can provide $\overline{IRST}$ having an asserted value (e.g., a high-voltage level) to close the switch 115 and the switch 116 of the integrator 110. In the offset phase, the switch 131 of the CDS 120 can also be closed using an offset signal (SHR) provided by the controller 180 when SEL_BANK provided by the controller 180 has the asserted value. For example, the controller 180 can provide SHR having an asserted value (e.g., a high-voltage level) to close the switch 131. Closing the switch 131 can be useful to couple the first sample capacitor 125 to the integrator output 119. The sensor switch 106 can remain open in the offset phase such that the integrator 110 is decoupled from a corresponding channel input (e.g., channel input N) of the input 102.

In the offset phase, the integrator output 119 can provide a signal (e.g., voltage) that corresponds to noise from various external sources or internal sources, such as a direct current (DC) offset and/or low-frequency noise (e.g., flicker noise or 1/f noise) related to operation of the amplifier 111. Operating the circuit 100 in the offset phase can be useful to provide a sample (offset sample) of the signal provided at the integrator output 119 to a bank of the CDS 120 that is operating in the sampling phase. The feedback capacitor 114 can store a charge (offset charge) that is proportional to the signal provided at the integrator output 119 in the offset phase. Providing the offset sample to the bank of the CDS 120 that is operating in the sampling phase can involve transferring the offset charge from the feedback capacitor 114 to a sample capacitor (e.g., the first sample capacitor 125) of that bank of the CDS 120.

In the signal phase, the switch 131 of the CDS 120 can be opened using SHR provided by the controller 180 when SEL_BANK provided by the controller 180 has the asserted value. For example, the controller 180 can provide SHR having a deasserted value (e.g., a low-voltage level) to open the switch 131 of the CDS 120. Opening the switch 131 can be useful to decouple the first sample capacitor 125 from the integrator output 119. The sensor switch 106 can be closed using a sample-and-hold signal (SHS) provided by the controller 180 such that the integrator 110 is coupled to a corresponding channel input (e.g., channel input N) of the input 102. For example, the controller 180 can provide SHS having an asserted value (e.g., a high-voltage level) to close the sample switch 106. The controller 180 can also provide SHS having the asserted value to close the switch 133 of the CDS 120 when SEL_BANK provided by the controller 180 has the asserted value. Closing the switch 133 can be useful to couple the second sample capacitor 126 to the integrator output 119.

In the signal phase, a sensor signal provided at a sensor output of a sensor can be provided to a particular channel input (e.g., channel input N) of the input 102 coupled to the sensor output. The integrator output 119 can provide a signal (e.g., voltage) in the signal phase that corresponds to both the sensor signal provided at the particular channel input of the input 102 and to the noise from external sources or internal sources. Operating the circuit 100 in the signal phase can be useful to provide a sample (signal sample) of the signal at the integrator output 119 to a bank of the CDS 120 that is operating in the sampling phase. The feedback capacitor 114 can store a charge (signal charge) that is proportional to the signal provided at the integrator output 119 in the signal phase. Providing the signal sample to the bank of the CDS 120 that is operating in the sampling phase can involve transferring the signal charge from the feedback capacitor 114 to a sample capacitor (e.g., the second sample capacitor 126) of that bank of the CDS 120.

As described above, a signal provided at the integrator output 119 in the signal phase can correspond to both a sensor signal provided at a particular channel input of the input 102 and to noise from external sources or internal sources whereas the signal provided at the integrator output 119 in the offset phase can correspond to the noise. A difference between a signal sample and an offset sample of the signal provided at the integrator output 119 can correspond to the sensor signal provided at the particular channel input of the input 102 in the signal phase. One difference between the signal sample and the offset sample is a charge difference between the signal charge and the offset charge transferred to sample capacitors (e.g., the first sample capacitor 125 and the second sample capacitor 126) of the bank of the CDS 120 in the sampling phase.

In the conversion phase, the CDS 120 can use the charge difference to provide the ADC block 150 with a sample (sensor sample) of the sensor signal provided at the particular channel input of the input 102 in the sampling phase. Providing the ADC block 150 with the sensor sample can involve providing the offset charge stored in the first sample capacitor 125 to the first subtractor input of the first subtractor 122 through the switch 132. Providing the ADC block 150 with the sensor sample can also involve providing the signal charge stored in the second sample capacitor 126 to the second subtractor input of the first subtractor 122 through the switch 134. The subtractor output of the first subtractor 122 can provide the charge difference responsive to providing the offset charge and the signal charge to the first and second subtractor inputs of the first subtractor 122, respectively. The switch 132 and the switch 134 of the CDS 120 can be closed in the conversion phase using a conversion signal (e.g., C_N) provided by the controller 180 when SEL_BANK provided by the controller 180 has the deasserted value. The conversion signal provided by the controller 180 can be channel input specific. Providing channel input specific conversion signals can be useful to sequentially convert sensor samples from each channel input of the input 102 into corresponding digital representations of the sensor samples at the output 104.

Figure 2:
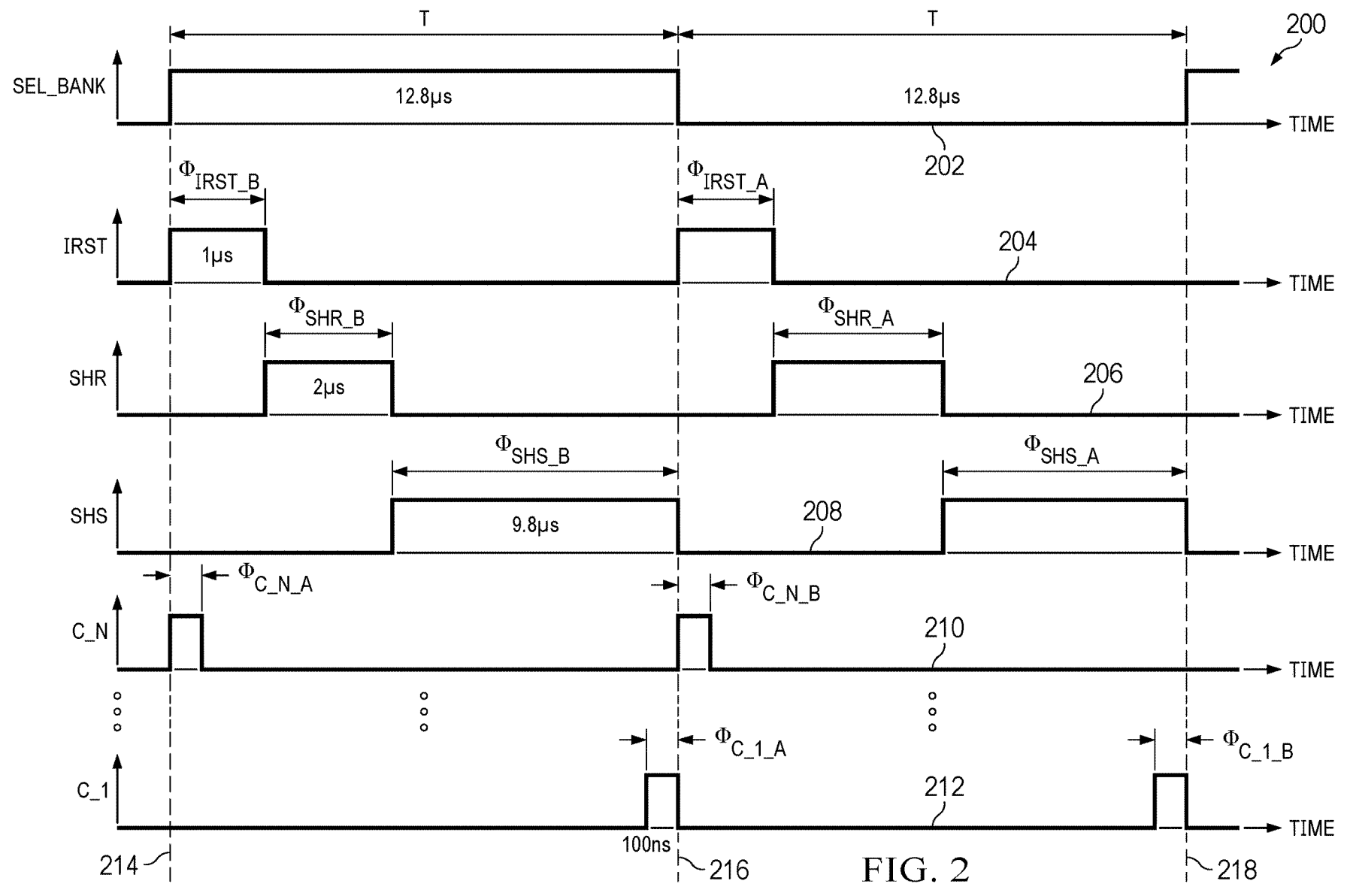

FIG. 2 is a diagram 200 of example waveforms that illustrate the various phases of operation. The diagram 200 represents different voltages in the circuit 100 as a function of time. The diagram 200 includes waveforms 202, 204, 206, 208, 210, and 212. Waveform 202 represents SEL_BANK provided by the controller 180 to the CDS 120 in the front end of the signal chain for each channel input of the input 102. The controller 180 can provide various signals related to the sampling phase, such as IRST, SHR, and SHS. Waveform 204 represents IRST provided by the controller 180. Waveform 206 represents SHR provided by the controller 180. Waveform 208 represents SHS provided by the controller 180. The controller 180 can also provide conversion signals that are channel input specific in the conversion phase. For example, the input 102 can include N channel inputs, where N is an integer greater than one. In this example, the controller 180 can provide conversion signals that are specific to each channel input of the N channel inputs composing the input 102, such as a conversion signal (C_1) that is specific to channel input 1 and a conversion signal (C_N) that is specific to channel input N. Waveforms 210 and 212 represent C_1 and C_N provided by the controller 180, respectively.

The diagram 200 includes a first time period between time 214 and time 216 where waveform 202 has a high-voltage value that represents SEL_BANK having an asserted value. The diagram 200 includes a second time period between time 216 and time 218 where waveform 202 has a low-voltage value that represents SEL_BANK having a deasserted value. As described above, SEL_BANK provided by the controller 180 can be useful to operate bank-A 121 and bank-B 123 of the CDS 120 in a complementary manner, such that one bank of the CDS 120 operates in the sampling phase while the other bank of the CDS 120 operates in the conversion phase. In FIG. 2, the first time period and the second time period can each represent a different frame time T.

The first time period between time 214 and time 216 can represent a frame time T where bank-B 123 of the CDS 120 for each channel input of the input 102 operates in the sampling phase while bank-A 121 operates in the conversion phase. During the frame time T represented by the first time period, the controller 180 can provide signals (e.g., IRST, SHR, and SHR) related to the sampling phase and signals (e.g., C_1 and C-N) related to the conversion phase to bank-B 123 and bank-A 121, respectively. The controller 180 can provide IRST having an asserted value to operate bank-B 123 in the reset phase of the sampling phase between time 214 and time 216, which is represented in FIG. 2 by $\Phi_{IRST\_B}$. The controller 180 can provide SHR having an asserted value to operate bank-B 123 in the offset phase of the sampling phase between time 214 and time 216, which is represented in FIG. 2 by $\Phi_{SHR\_B}$. The controller 180 can provide SHS having an asserted value to operate bank-B 123 in the signal phase of the sampling phase between time 214 and time 216, which is represented in FIG. 2 by $\Phi_{SHS\_B}$.

The conversion phase between time 214 and time 216 can be partitioned into multiple conversion sub-phases where each conversion sub-phase is specific to a particular channel input of the N channel inputs composing the input 102. Partitioning the conversion phase of the circuit 100 into channel input specific conversion sub-phases can be useful to sequentially convert sensor samples from each channel input of the input 102 into corresponding digital representations of the sensor samples at the output 104. At time 214, the controller 180 can provide C_N having an asserted value to operate bank-A 121 in a conversion sub-phase that is specific to channel input N, which is represented in FIG. 2 by $\Phi_{C\_N\_A}$. The controller 180 can provide C_1 having an asserted value to operate bank-A 121 in a conversion sub-phase that is specific to channel input 1, which is represented in FIG. 2 by $\Phi_{C\_1\_A}$.

In at least one example, each conversion sub-phase in the first time period can have a duration that is about a duration of the frame time T divided by the N channel inputs composing the input 102. For example, the frame time T represented by the first time period can have a duration of about 12.8 microseconds and the input 102 can include 128 channel inputs. In this example, each conversion sub-phase in the first time period can have a duration of about 100 nanoseconds (e.g., 12.8 microseconds/128 channel inputs).

The second time period between time 216 and time 218 can represent a frame time T where bank-A 121 of the CDS 120 for each channel input of the input 102 operates in the sampling phase while bank-A 123 operates in the conversion phase. During the frame time T represented by the second time period, the controller 180 can provide signals (e.g., IRST, SHR, and SHR) related to the sampling phase and signals (e.g., C_1 and C_N) related to the conversion phase to bank-A 121 and bank-B 123, respectively. The controller 180 can provide IRST having an asserted value to operate bank-A 121 in the reset phase of the sampling phase between time 216 and time 218, which is represented in FIG. 2 by $\Phi_{IRST\_A}$. The controller 180 can provide SHR having an asserted value to operate bank-A 121 in the offset phase of the sampling phase between time 216 and time 218, which is represented in FIG. 2 by $\Phi_{SHR\_A}$. The controller 180 can provide SHS having an asserted value to operate bank-A 121 in the signal phase of the sampling phase between time 216 and time 218, which is represented in FIG. 2 by $\Phi_{SHS\_A}$.

The conversion phase between time 216 and time 218 can be partitioned into multiple conversion sub-phases where each conversion sub-phase is specific to a particular channel input of the N channel inputs composing the input 102. Partitioning the conversion phase of the circuit 100 into multiple conversion sub-phases can be useful to sequentially convert sensor samples from each channel input of the input 102 into corresponding digital representations of the sensor samples at the output 104. At time 216, the controller 180 can provide C_N having an asserted value to operate bank-B 123 in a conversion sub-phase that is specific to channel input N, which is represented in FIG. 2 by $\Phi_{C\_N\_B}$. The controller 180 can provide C_1 having an asserted value to operate bank-B 123 in a conversion sub-phase that is specific to channel input 1, which is represented in FIG. 2 by $\Phi_{C\_1\_B}$.

In at least one example, each conversion sub-phase in the second time period can have a duration that is about a duration of the frame time T divided by the N channel inputs composing the input 102. For example, the frame time T represented by the second time period can have a duration of about 12.8 microseconds and the input 102 can include 128 channel inputs. In this example, each conversion sub-phase in the second time period can have a duration of about 100 nanoseconds (e.g., 12.8 microseconds/128 channel inputs).

Figure 3:
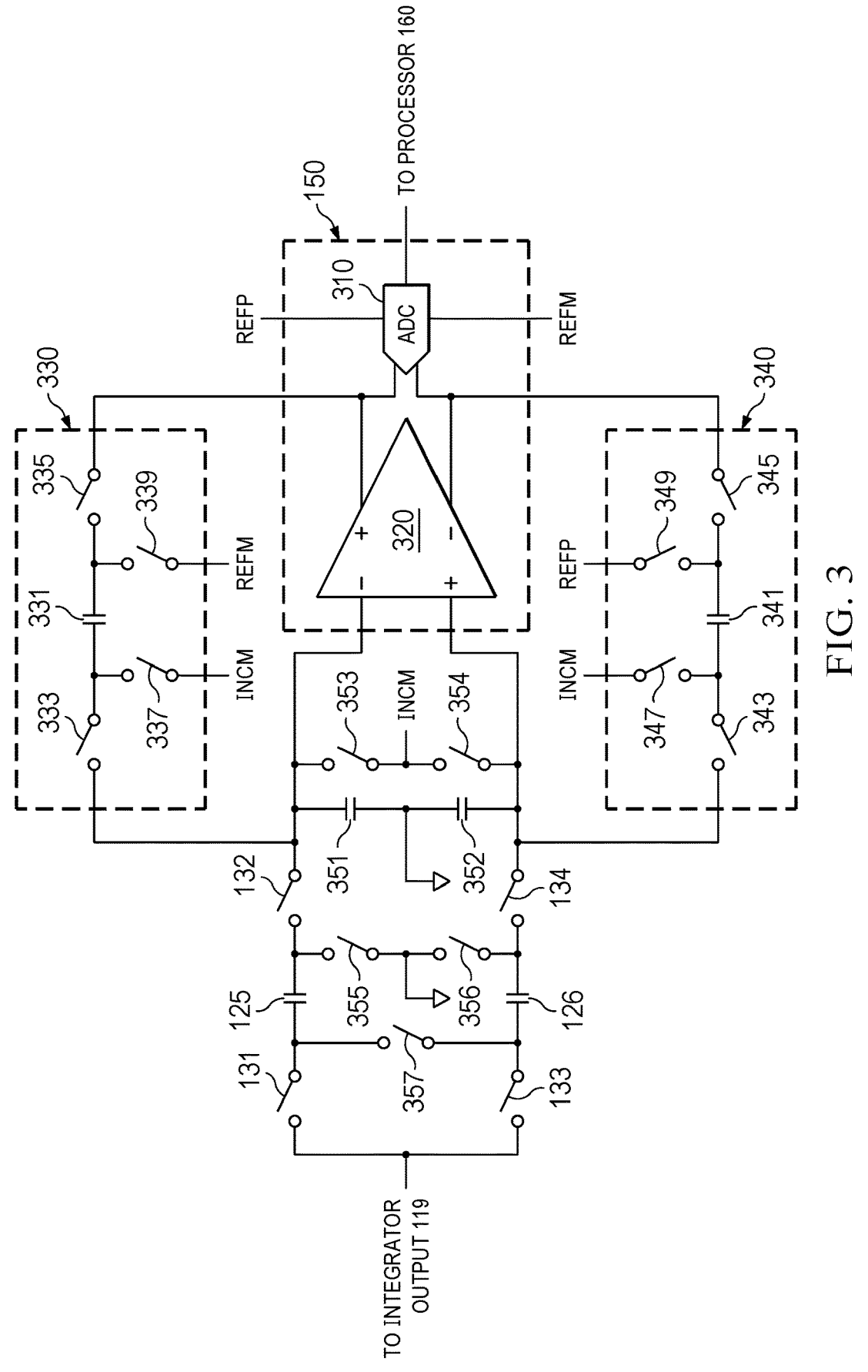
FIG. 3 is a block diagram of an example implementation of a portion of a circuit for sampling signals.

FIG. 3 is a block diagram of an example implementation of a portion of the circuit 100. The portion of the circuit 100 shown in FIG. 3 corresponds to channel input N of the input 102. FIG. 3 is representative of a signal chain for channel input N of the input 102 between the integrator output 119 of the integrator 110 and the ADC block 150. For example, the portion of the circuit 100 shown in FIG. 3 includes the first sample capacitor 125 and the second sample capacitor 126 that form bank-A of the CDS 120 comprising a front end of the signal chain for channel input N of the input 102. The portion of the circuit 100 shown in FIG. 3 also includes the ADC block 150 comprising a back end of the signal chain for channel input N of the input 102.

In at least some examples, the ADC block 150 includes an ADC 310 and an amplifier 320 configured to drive the ADC 310. The amplifier 320 can provide an interface between the ADC 310 and multiple channel inputs (e.g., channel input N) of the input 102. The interface provided by the amplifier 320 can be useful to increase a number of channel inputs that provide sensor samples to the ADC 310 for conversion. The interface provided by the amplifier 320 can also be useful to mitigate resetting the ADC 310 between sensor sample conversions thereby increasing a conversion rate of the ADC 310. The amplifier 320 includes a first amplifier input (e.g., an inverting input), a second amplifier input (e.g., a non-inverting input), a first amplifier output (e.g., a positive output), and a second amplifier output (e.g., a negative output). The first and second amplifier inputs of the amplifier 320 can form a differential input of the amplifier 320. The first and second amplifier outputs of the amplifier 320 can form a differential output of the amplifier 320. In at least one example, the amplifier 320 can be Miller compensated.

The back end of the signal chain for channel input N of the input 102 can include a feedback loop 330 coupled between the first amplifier input of the amplifier 320 and the first amplifier output of the amplifier 320. The feedback loop 330 can include a feedback capacitor 331. The feedback capacitor 331 can be coupled to: the first amplifier input of the amplifier 320 through a switch 333; the first amplifier output of the amplifier 320 through a switch 335; a common mode input voltage provided by the differential input of the amplifier 320 through a switch 337; and a first reference voltage (e.g., a negative reference voltage) of the ADC 310 through a switch 339. The common mode input voltage provided by the differential input of the amplifier 320 is represented in FIG. 3 by INCM. The first reference voltage of the ADC 310 is represented in FIG. 3 by REFM. In at least one example, the feedback capacitor 331 can generally be in the order of picofarads such as about 8 pF.

The back end of the signal chain for channel input N of the input 102 can also include a feedback loop 340 coupled between the second amplifier input of the amplifier 320 and the second amplifier output of the amplifier 320. The feedback loop 340 can include a feedback capacitor 341. The feedback capacitor 341 can be coupled to: the second amplifier input of the amplifier 320 through a switch 343; the second amplifier output of the amplifier 320 through a switch 345; INCM through a switch 347; and a second reference voltage (e.g., a positive reference voltage) of the ADC 310 through a switch 349. The second reference voltage of the ADC 310 is represented in FIG. 3 by REFP. In at least one example, the feedback capacitor 341 can generally be in the order of picofarads such as about 8 pF.

The back end of the signal chain for channel input N of the input 102 can also include a first parasitic capacitance 351 and a second parasitic capacitance 352 associated with the first amplifier input and the second amplifier input of the amplifier 320, respectively. FIG. 3 shows the first parasitic capacitance 351 and the second parasitic capacitance 352 as physical capacitors for illustration purposes. However, the first parasitic capacitance 351 and the second parasitic capacitance 352 represent input parasitic capacitance at the first and second amplifier inputs of the amplifier 320, respectively. Sources of the first parasitic capacitance 351 and/or the second parasitic capacitance 352 can include: the amplifier 320; one or more of switches 132, 134, 333, and 343; trace routing; the multiplexer 140, and/or other sources of input parasitic capacitance. In at least one example, the first parasitic capacitance 351 and/or the second parasitic capacitance 352 can generally be in the order of picofarads such as about 8 pF. The back end of the signal chain for channel input N of the input 102 can also include switches 353, 354, 355, 356, and 357.

In an example architecture, an ADC output of the ADC 310 can be coupled to the processor 160. A first ADC input and a second ADC input of the ADC 310 can be coupled to the first amplifier output and the second amplifier output of the amplifier 320, respectively. The switch 353 and the switch 354 can be coupled in series between the first and second amplifier inputs of the amplifier 320. The first sample capacitor 125 can be coupled to the first amplifier input of the amplifier 320 through the switch 132. The first sample capacitor 125 can be coupled to a ground terminal through the switch 355. The second sample capacitor 126 can be coupled to the second amplifier input of the amplifier 320 through the switch 134. The second sample capacitor 126 can be coupled to a ground terminal through the switch 356. A first terminal of the switch 357 can be coupled between the switch 131 and the first sample capacitor 125. A second terminal of the switch 357 can be coupled between the switch 133 and the second sample capacitor 126.

Figure 4:
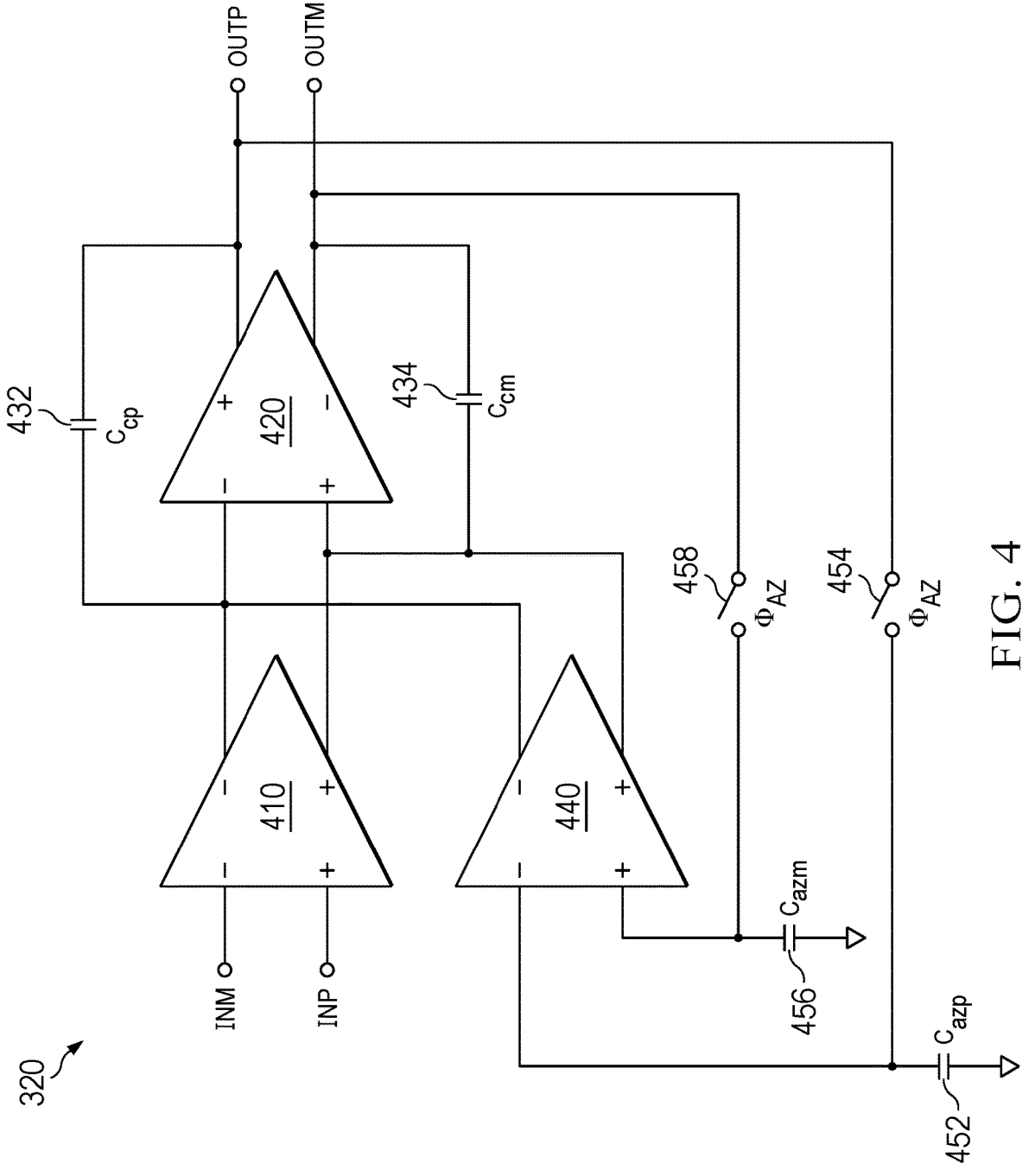
FIG. 4 is a circuit diagram of an example implementation of an amplifier, in accordance with various examples.

FIG. 4 is a block diagram of an example implementation of the amplifier 320, in accordance with various examples. In at least one example, the amplifier 320 can include a first amplifier stage 410, a second amplifier stage 420, a compensation capacitor 432, a compensation capacitor 434, an auto-zero (AZ) amplifier 440, a capacitor 452, a switch 454, a capacitor 456, and a switch 458. In at least one example, the first amplifier stage 410 and the second amplifier stage 420 can each have a transconductance that is greater than a transconductance of the AZ amplifier 440. For example, the first amplifier stage 410 and the second amplifier stage 420 can each have a transconductance that is about eight times greater than a transconductance of the AZ amplifier 440.

In an example architecture, a first stage input (e.g., an inverting input) and a second stage input (e.g., a non-inverting input) of the first stage amplifier 410 are coupled to the first and second amplifier inputs of the amplifier 320, respectively. A first stage output (e.g., a negative output) and a second stage output (e.g., a positive output) of the first stage amplifier 410 are coupled to a first stage input (e.g., an inverting input) and a second stage input (e.g., a non-inverting input) of the second stage amplifier 420, respectively. A first stage output (e.g., a positive output) and a second stage output (a negative output) of the second stage amplifier 420 are coupled to the first and second amplifier outputs of the amplifier 320, respectively.

The compensation capacitor 432 is coupled between the first stage input and the first stage output of the second stage amplifier 420. The compensation capacitor 434 is coupled between the second stage input and the second stage output of the second stage amplifier 420. A first AZ input (e.g., an inverting input) of the AZ amplifier 440 is coupled to a ground terminal through the capacitor 452. A second AZ input (e.g., a non-inverting input) of the AZ amplifier 440 is coupled to a ground terminal through the capacitor 456. A first AZ output (e.g., a negative output) of the AZ amplifier 440 is coupled between the first stage output of the first amplifier stage 410 and the first stage input of the second amplifier stage 420. A second AZ output (e.g., a positive output) of the AZ amplifier 440 is coupled between the second stage output of the first amplifier stage 410 and the second stage input of the second amplifier stage 420. A first terminal of the switch 454 is coupled between the second parasitic capacitance 352 and the first AZ input of the AZ amplifier 440. A second terminal of the switch 454 is coupled to the first stage output of the second stage amplifier 420. A first terminal of the switch 458 is coupled between the second AZ input of the AZ amplifier 440 and the capacitor 456. A second terminal of the switch 458 is coupled to the second stage output of the second stage amplifier 420.

An example operation of the portion of the circuit 100 shown by FIG. 3 is described with respect to FIG. 3 and FIG. 4. As described above, the conversion phase of the circuit 100 can be partitioned into multiple conversion sub-phases where each conversion sub-phase is specific to a particular channel input of the input 102. The example operation described with respect to FIG. 3 and FIG. 4 can represent a conversion sub-phase (e.g., $\Phi_{C\_N\_A}$) that is specific to channel input N of the input 102. A conversion sub-phase can include a first phase and a hold phase. The first phase of the conversion sub-phase can include an AZ phase and a shorting phase. In at least one example, overlap can exist between the AZ phase and the shorting phase during the first phase.

In the AZ phase ($\Phi_{AZ}$), the controller 180 can provide an AZ signal (A/Z) to close switches 454 and 458 of the amplifier 320. For example, the controller 180 can provide A/Z having an asserted value (e.g., a high-voltage level) to close switches 454 and 458 of the amplifier 320. The capacitor 452 can store, responsive to closing the switch 454 in the AZ phase, a charge ($Q_{off\_1}$) that is proportional to offset at the first stage output of the second stage amplifier 420, such as DC offset and/or low-frequency noise (e.g., flicker noise or 1/f noise related to operation of the amplifier 320). The capacitor 456 can store, responsive to closing the switch 458, a charge ($Q_{off\_2}$) that is proportional to offset at the second stage output of the second stage amplifier 420, such as DC offset and/or low-frequency noise (e.g., flicker noise or 1/f noise related to operation of the amplifier 320). Operation of the amplifier 320 in the AZ phase related to sampling offset at the first and second stage outputs of the second stage amplifier 420 can also generate noise (AZ noise). In addition to storing charges related to offset (e.g., $Q_{off\_1}$ and $Q_{off\_2}$), capacitors 452 and 456 can each store additional charge related to AZ noise. For example, the capacitor 452 can store a charge ($Q_{AZ\_1}$) related to AZ noise, such as reset noise of the coupling capacitor 432. Another example, the capacitor 456 can store a charge ($Q_{AZ\_2}$) related to AZ noise, such as reset noise of the coupling capacitor 434.

In the shorting phase, the controller 180 can provide a shorting phase signal (SP) having an asserted value (e.g., a high-voltage value) to close: switches 337 and 339 of the feedback loop 330; switches 347 and 349 of the feedback loop 340; the switch 353; and the switch 354. Closing the switch 337 of the feedback loop 330 can couple a first terminal of the feedback capacitor 331 to INCM. Closing the switch 339 of the feedback loop 330 can couple a second terminal of the feedback capacitor 331 to REFM. Coupling the first and second terminals of the feedback capacitor 331 to INCM and to REFM in the shorting phase, respectively, can be useful to reset charge stored in the feedback capacitor 331 between consecutive hold phases. Resetting the charge stored in the feedback capacitor 331 to REFM can introduce reset noise on the feedback capacitor 331 and on the first parasitic capacitance 351 related to a source (e.g., reference generator 170) providing REFM to the ADC 310. Accuracy of digital representations provided by the ADC 150 can be reduced by reset noise introduced on the feedback capacitor 331 or the first parasitic capacitance 351 from the source providing REFM to the ADC 310.

Closing the switch 347 of the feedback loop 340 can couple a first terminal of the feedback capacitor 341 to INCM. Closing the switch 349 of the feedback loop 340 can couple a second terminal of the feedback capacitor 341 to REFP. Coupling the first and second terminals of the feedback capacitor 341 to INCM and to REFP in the shorting phase, respectively, can reset charge stored in the feedback capacitor 341 between consecutive hold phases. Resetting the charge stored in the feedback capacitor 341 to REFP can introduce reset noise on the feedback capacitor 341 and on the second parasitic capacitance 352 related to a source (e.g., reference generator 170) providing REFP to the ADC 310. Closing switches 353 and 354 can be useful to reset charges stored by the first parasitic capacitance 351 and the second parasitic capacitance 352, respectively, between consecutive hold phases. Accuracy of digital representations provided by the ADC 150 can be reduced by reset noise introduced on the feedback capacitor 341 or the second parasitic capacitance 352 from the source providing REFP to the ADC 310.

In the hold phase, the controller 180 can provide a hold signal (HOLD) having an asserted value (e.g., a high-voltage value) to close: switches 333 and 335 of the feedback loop 330; switches 343 and 345 of the feedback loop 340; the switch 353; and the switch 354. Closing switches 333 and 335 can be useful to couple the feedback loop 330 between the first amplifier input and the first amplifier output of the amplifier 320. Closing switches 343 and 345 can be useful to couple the feedback loop 340 between the second amplifier input and the second amplifier output of the amplifier 320.

As described above, the example operation described with respect to FIG. 3 and FIG. 4 can represent a conversion sub-phase (e.g., $\Phi_{C\_N\_A}$) that is specific to channel input N of the input 102. Accordingly, the controller 180 can also provide C_N (e.g., a conversion signal that is specific to channel input N) having an asserted value (e.g., a high-voltage value) during the conversion sub-phase that is specific to channel input N of the input 102. Switches 132 and 134 can each close responsive to HOLD and C_N both having asserted values. Closing switches 132 and 134 during the conversion sub-phase that is specific to channel input N of the input 102 can be useful to provide a sensor sample from channel input N to the ADC block 150. Providing the sensor sample from channel-input N of the input 102 to the ADC block 150 can involve transferring a signal charge from the first sampling capacitor 125 and an offset charge from the second sampling capacitor 126 to the first and second amplifier inputs of the amplifier 320, respectively. The ADC block 150 can provide, responsive to providing the sensor sample from channel-input N of the input 102 to the ADC block 150, a digital representation of that sensor sample to the processor 160.

In the hold phase, the controller 180 can also provide SP having a deasserted value (e.g., a low-voltage value). Providing SP having the deasserted value can be useful to open: switches 337 and 339 of the feedback loop 330; switches 347 and 349 of the feedback loop 340; the switch 353; and the switch 354. Opening switches 337 and 339 can introduce additional reset noise on the feedback capacitor 331 related to thermal noise (e.g., kTC noise) from switches 337 and 339. Opening switches 347 and 349 can introduce additional reset noise on the feedback capacitor 341 related to thermal noise (e.g., kTC noise) from switches 347 and 349. Opening the switch 353 can introduce additional reset noise on the first parasitic capacitance 351 related to thermal noise (e.g., kTC noise) from the switch 353. Opening the switch 354 can introduce additional reset noise on the second parasitic capacitance 352 related to thermal noise (e.g., kTC noise) from the switch 354. Accuracy of digital representations provided by the ADC 150 can be reduced by reset noise introduced on feedback capacitors (e.g., feedback capacitors 331 and 341) of the amplifier 320 or parasitic capacitance (e.g., parasitic capacitances 351 and 352) at an input of the amplifier 320 by operation of switches (e.g., switches 337, 339, 347, and 349, 351, and 352).

In the hold phase, the controller 180 can also provide A/Z having a deasserted value (e.g., a low-voltage value). Providing A/Z having the deasserted value can be useful to open switches 454 and 458 of the amplifier 320. $Q_{off\_1}$ and $Q_{off\_2}$ stored in capacitors 452 and 456, respectively, can be useful to reduce or nullify offset of the amplifier 320 by operation of feedback provided by the AZ amplifier 440. $Q_{AZ\_1}$ and $Q_{AZ\_2}$ stored in capacitors 452 and 456, respectively, can represent error in the feedback provided by the AZ amplifier 440.

For example, voltage at the first and second amplifier outputs of the amplifier 320 can be controlled using feedback provided by the AZ amplifier 440. During the hold phase, the first and second amplifier inputs of the amplifier 320 can be floating. Accordingly, the feedback provided by the AZ amplifier 440 can also control voltage at the first and second amplifier inputs of the amplifier 320 in the hold phase. Absent AZ noise charge (e.g., $Q_{AZ\_1}$ and $Q_{AZ\_2}$ stored in capacitors 452 and 456, respectively), the feedback provided by the AZ amplifier 440 can control voltage at the first and second amplifier inputs of the amplifier 320 towards ground potential to reduce or nullify offset of the amplifier 320 using $Q_{off\_1}$ and $Q_{off\_2}$ stored in capacitors 452 and 456, respectively.

The feedback provided by the AZ amplifier 440 can control voltage at the first and second amplifier inputs of the amplifier 320 away from ground potential responsive to $Q_{AZ\_1}$ and $Q_{AZ\_2}$ stored in capacitors 452 and 456, respectively. In at least one example, a voltage ($V_{n1}$) at the first amplifier input of the amplifier 320 can be determined by equation (1):

$$V_{n1}=Q_{AZ\_1}/C_{452}, \tag{1}$$

where $C_{452}$ is a capacitance of the capacitor 452. In at least one example, a voltage ($V_{n2}$) at the second amplifier input of the amplifier 320 can be determined by equation (2):

$$V_{n2}=Q_{AZ\_2}/C_{456}, \tag{2}$$

where $C_{456}$ is a capacitance of the capacitor 456.

The portion of the circuit 100 shown by FIG. 3 can provide AZ noise charge to the feedback capacitor 331, to the first sampling capacitor 125, and to the first parasitic capacitance 351 through the feedback capacitor 331 during the hold phase. In at least one example, the AZ noise charge provided through the feedback capacitor 331 during the hold phase in FIG. 3 can be determined by equation (3):

$$C_{125}*V_{n1}+C_{331}*V_{n1}+C_{351}*V_{n1}, \tag{3}$$

where: $C_{125}$ is a capacitance of the first sampling capacitor 125; $C_{331}$ is a capacitance of the feedback capacitor 331; and $C_{351}$ is the first parasitic capacitance 351. In at least one example, a gain of the AZ noise charge provided through the feedback capacitor 331 in FIG. 3 can be determined by equation (4):

$$(C_{125}+C_{331}+C_{351})/C_{331}. \tag{4}$$

The portion of the circuit 100 shown by FIG. 3 can provide AZ noise charge to the feedback capacitor 341, to the first sampling capacitor 126, and to the second parasitic capacitance 352 through the feedback capacitor 341 during the hold phase. In at least one example, the AZ noise charge provided through the feedback capacitor 341 during the hold phase in FIG. 3 can be determined by equation (5):

$$C_{126}*V_{n2}+C_{341}*V_{n2}+C_{352}*V_{n2}, \tag{5}$$

where: $C_{126}$ is a capacitance of the second sampling capacitor 126; $C_{341}$ is a capacitance of the feedback capacitor 341; and $C_{352}$ is the second parasitic capacitance 352. In at least one example, a gain of the AZ noise charge provided through the feedback capacitor 341 in FIG. 3 can be determined by equation (6):

$$(C_{126}+C_{341}+C_{352})/C_{341}. \tag{6}$$

While the circuitry of FIGS. 3 and 4 is described with reference to channel input N of the input 102, in other examples this circuitry is applied to all or a portion of the other channels.

Figure 5:
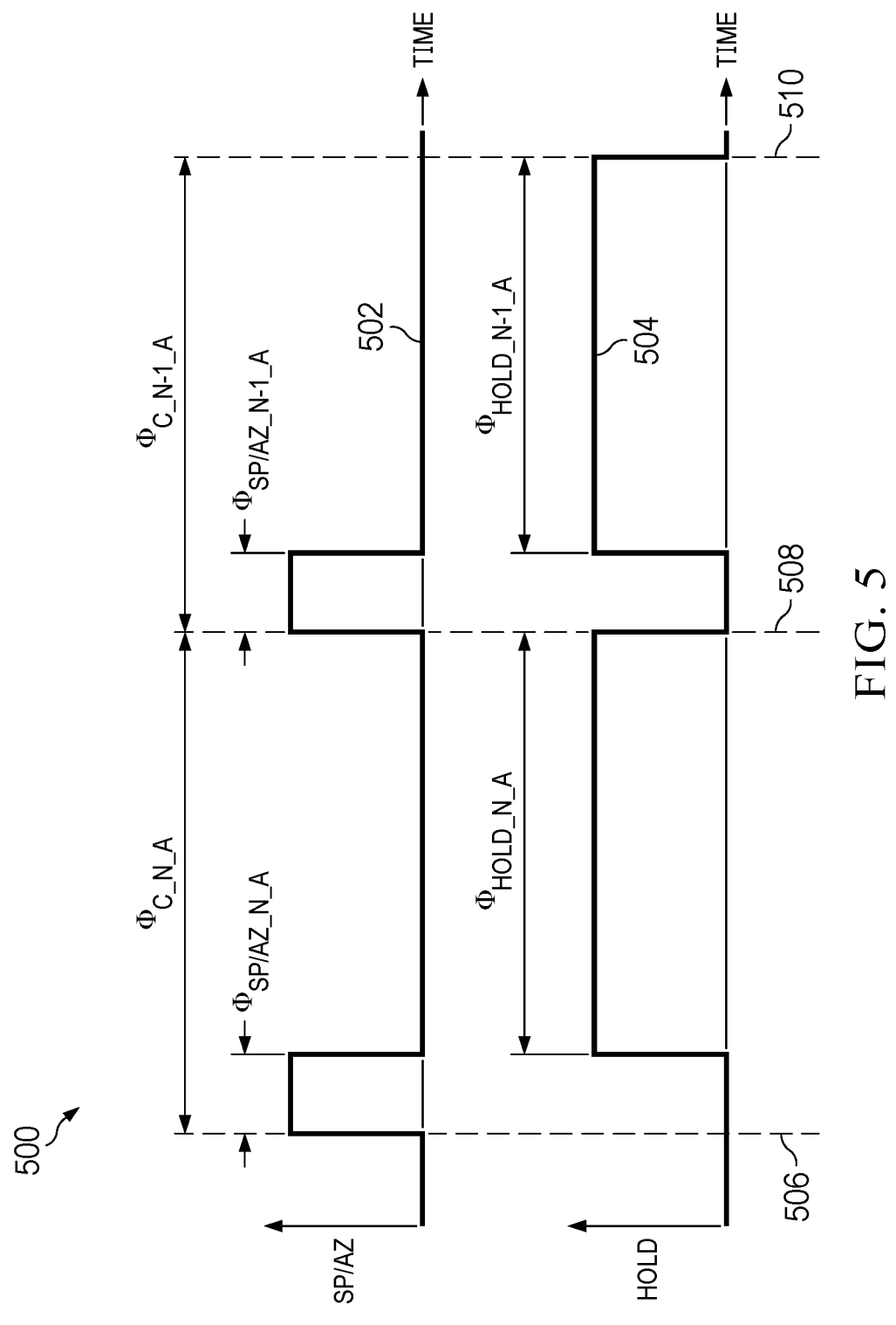
FIG. 5 is a diagram of example waveforms versus time for a circuit for sampling signals.

FIG. 5 is a diagram 500 of example waveforms in the circuit 100 that illustrate conversion sub-phase operation. The diagram 500 represents different voltages in the circuit 100 as a function of time. The diagram 500 includes waveforms 502 and 504. Waveform 502 represents a summation of SP and A/Z provided by the controller 180. Waveform 504 represents HOLD provided by the controller 180. The diagram 500 includes a first time period between time 506 and time 508 that corresponds to a conversion sub-phase that is specific to channel input N of the input 102. The conversion sub-phase that is specific to channel input N of the input 102 is represented in FIG. 5 by $\Phi_{C\_N\_A}$. In at least one example, time 506 in FIG. 5 can correspond to time 214 in FIG. 2. The diagram 500 also includes a second time period between time 508 and time 510 that corresponds to a conversion sub-phase that is specific to channel input N−1 of the input 102. The conversion sub-phase that is specific to channel input N−1 of the input 102 is represented in FIG. 5 by $\Phi_{C\_N-1\_A}$.

Each conversion sub-phase shown in the diagram 500 includes a first portion where waveform 502 has a high-voltage value and a second portion where waveform 504 has a high-voltage value. As described above, a conversion sub-phase can include a first phase and a hold phase. The first portion of each conversion sub-phase shown in the diagram 500 where waveform 502 has the high-voltage value represents a first phase of a conversion sub-phase that is specific to a particular channel input of the input 102. As described above, the first phase of a conversion sub-phase can include an AZ phase and a shorting phase. Waveform 502 having the high-voltage value represents the controller 180 providing one or more of A/Z and SP having an asserted value. The second portion of each conversion sub-phase shown in the diagram 500 where waveform 504 has the high-voltage value represents a hold phase of a conversion sub-phase that is specific to a particular channel input of the input 102. Waveform 504 having the high-voltage value represents the controller 180 providing HOLD having an asserted value.

For example, the first portion of the first time period where waveform 502 has the high-voltage value represents a first phase of the conversion sub-phase that is specific to channel input N of the input 102. The first phase of the conversion sub-phase that is specific to channel input N of the input 102 is represented in FIG. 5 by $\Phi_{SP/AZ\_N\_A}$. In this example, the second portion of the first time period where waveform 504 has the high-voltage value represents a hold phase of the conversion sub-phase that is specific to channel input N of the input 102. The hold phase of the conversion sub-phase that is specific to channel input N of the input 102 is represented in FIG. 5 by $\Phi_{HOLD\_N\_A}$.

Another example, the first portion of the second time period where waveform 502 has the high-voltage value represents a first phase of the conversion sub-phase that is specific to channel input N−1 of the input 102. The first phase of the conversion sub-phase that is specific to channel input N−1 of the input 102 is represented in FIG. 5 by $\Phi_{SP/AZ\_N-1\_A}$. In this example, the second portion of the second time period where waveform 504 has the high-voltage value represents a hold phase of the conversion sub-phase that is specific to channel input N−1 of the input 102. The hold phase of the conversion sub-phase that is specific to channel input N−1 of the input 102 is represented in FIG. 5 by $\Phi_{HOLD\_N-1\_A}$.

As described above, the circuit 100 can include multiple signal chains where each signal chain can represent a path of a sensor signal from a particular channel input of the input 102 to the output 104. Each signal chain of the circuit 100 is configured to provide, responsive to a sensor signal provided at a particular channel input of the input 102, a digital representation of the sensor signal at the output 104. Noise contributed by sources internal to the circuit 100 or noise contributed by sources external to the circuit 100 can reduce an accuracy of a digital representation provided at the output 104. Noise contributed by sources internal to the circuit 100 can include front end noise and back end noise.

Front end noise can include noise that is contributed by components forming a front end of a given signal chain of the circuit 100, such as the integrator 110 and the CDS 120 that couple a particular channel input of the input 102 to the multiplexer 140. Back end noise can include noise that is contributed by components forming a back end of the given signal chain of the circuit 100, such as the ADC block 150 and the processor 160. Relative contributions of front end noise and back end noise to total signal chain noise can vary in different applications. For example, a contribution of back end noise can exceed a contribution of front end noise to total signal chain noise in higher charge range applications such as static X-ray imaging applications where increasing feedback (e.g., the feedback circuit 112) in the integrator 110 decreases front end gain in a given signal chain. In some higher charge range applications, a contribution of front end noise to total signal chain noise can become negligible.

Averaging digital representations provided by the ADC 310 responsive to sampling and converting an output (e.g., the first amplifier output and/or the second amplifier output) of the amplifier 320 multiple times can be useful to reduce signal chain noise in applications with larger view times. For example, averaging can be useful to reduce signal chain noise associated with: operation of the ADC 310; sampling phase operation of the CDS 120; switch resistance and routing resistance during hold phase operation of the circuit 100; and hold phase operation of the amplifier 320. Averaging is generally ineffective in reducing some signal chain noise such as sampled noise. For example, averaging can be ineffective in reducing signal chain noise, such as: reset noise introduced on feedback capacitors (e.g., feedback capacitors 331 and 341) of the amplifier 320 or parasitic capacitance (e.g., parasitic capacitances 351 and 352) at an input of the amplifier 320 by operation of switches (e.g., switches 337, 339, 347, and 349, 351, and 352); reset noise introduced on feedback capacitors of the amplifier 320 or parasitic capacitance at an input of the amplifier 320 from a source (e.g., the reference generator 170) providing reference voltage (e.g., REFM and REFP) to the ADC; and AZ noise relating to sampling operation of the amplifier 320 during the AZ phase.

Conventional approaches to reducing signal chain noise where averaging is generally ineffective can involve increasing a supply voltage of the integrator 110 to increase signal swing at the integrator output 119. Conventional approaches to reducing signal chain noise where averaging is generally ineffective can also involve increasing feedback capacitance (e.g., the feedback capacitor 114) at the integrator 110 and/or increasing sampling capacitance (e.g., the first sampling capacitor 125, the second sampling capacitor 126, the third sampling capacitor 127, and/or the fourth sampling capacitor 128) at the CDS 120. Increasing a supply voltage of the integrator 110, increasing feedback capacitance at the integrator 110, and/or increasing sampling capacitance at the CDS 120 can increase front end gain and reduce signal chain noise where averaging is generally ineffective. However, increasing front end gain and reducing signal chain noise through such conventional approaches can increase circuit area and power consumption of the circuit 100.

Figure 6:
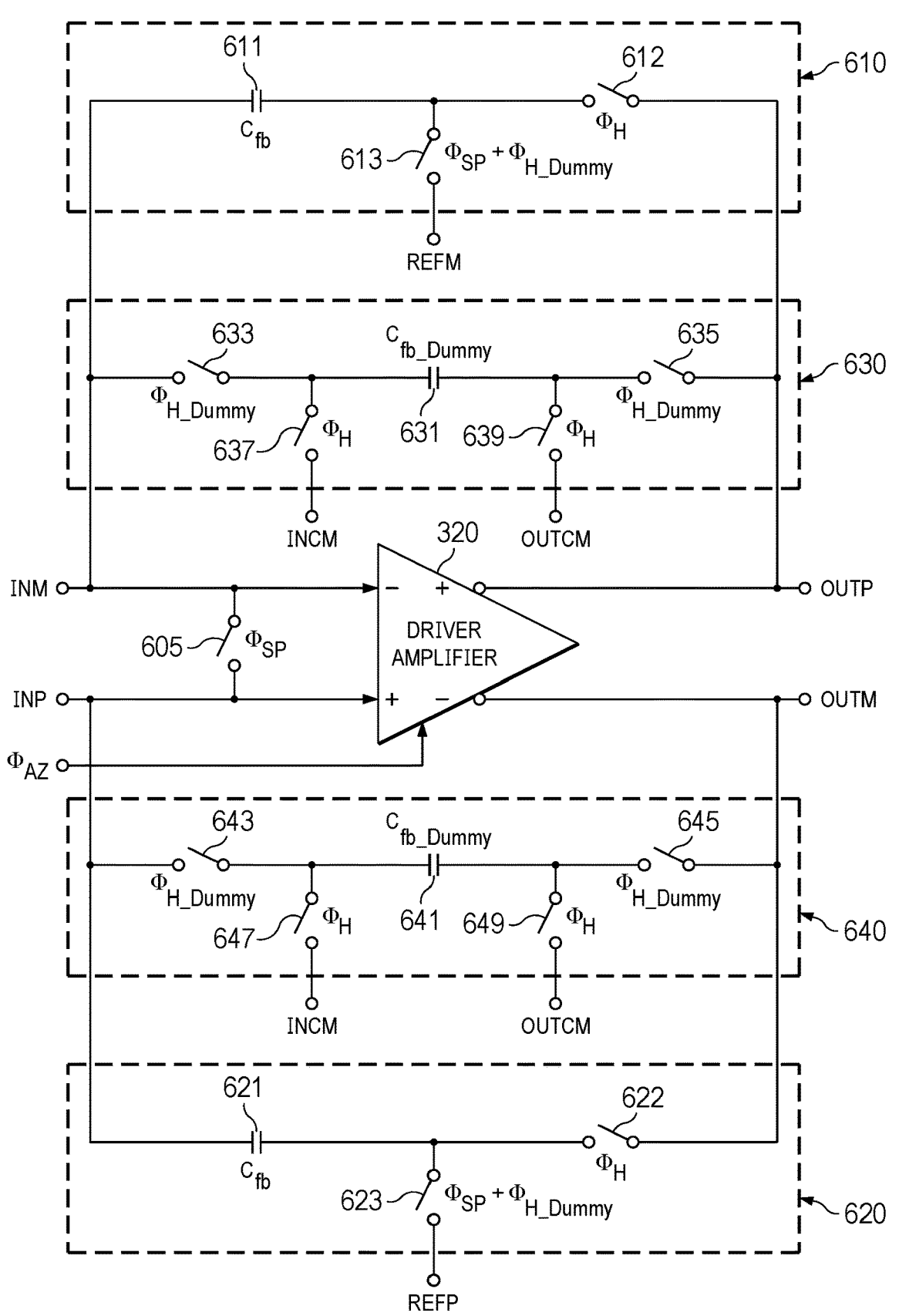
FIG. 6 is a circuit diagram of an example implementation of a portion of a circuit for sampling signals, in accordance with various examples.

FIG. 6 is a block diagram of an example implementation of a portion of the circuit 100. The portion of the circuit 100 shown in FIG. 6 can be useful for driving the ADC 310 in the back end of the signal chain for any or all of the channels of the input 102. The following is a description for channel input N. For example, the portion of the circuit 100 shown in FIG. 6 includes the amplifier 320. A switch 605 can be coupled between the first amplifier input (e.g., the inverting input) and the second amplifier input (e.g., the non-inverting input) of the amplifier 320. The first and second amplifier inputs (INM and INP) of the amplifier 320 can form a differential input of the amplifier 320, as described above.

A feedback loop 610 can include a feedback capacitor 611 and a switch 612. The feedback capacitor 611 and the switch 612 can be coupled in series between the first amplifier input of the amplifier 320 and the first amplifier output (e.g., the positive output) of the amplifier 320. The feedback loop 610 can also include a switch 613. The feedback capacitor 611 and the switch 612 can be coupled to the first reference voltage (e.g., the negative reference voltage) of the ADC 310 through the switch 613. The first reference voltage of the ADC 310 is represented in FIG. 6 by REFM. In at least one example, the feedback capacitor 611 can generally be in the order of picofarads such as about 8 pF.

A feedback loop 620 can include a feedback capacitor 621 and a switch 622. The feedback capacitor 621 and the switch 622 can be coupled in series between the second amplifier input of the amplifier 320 and the second amplifier output (e.g., the negative output) of the amplifier 320. The first and second amplifier outputs of the amplifier 320 can form a differential output of the amplifier 320, as described above. The feedback loop 620 can also include a switch 623. The feedback capacitor 621 and the switch 622 can be coupled to the second reference voltage (e.g., the positive reference voltage) of the ADC 310 through the switch 623. The second reference voltage of the ADC 310 is represented in FIG. 6 by REFP. In at least one example, the feedback capacitor 621 can generally be in the order of picofarads such as about 8 pF.

A feedback loop 630 can be coupled in parallel with the feedback loop 610 between the first amplifier input of the amplifier 320 and the first amplifier output of the amplifier 320. The feedback loop 630 can include a feedback capacitor 631. The feedback capacitor 631 can be coupled to: the first amplifier input of the amplifier 320 through a switch 633; the first amplifier output of the amplifier 320 through a switch 635; a common mode input voltage provided by the differential input of the amplifier 320 through a switch 637; and a common mode output voltage provided by the differential output of the amplifier 320 through a switch 639. The common mode input voltage provided by the differential input of the amplifier 320 is represented in FIG. 6 by INCM. The common mode output voltage provided by the differential output of the amplifier 320 is represented in FIG. 6 by OUTCM. In at least one example, the feedback capacitor 631 can generally be in the order of picofarads such as about 1 pF.

In at least one example, a capacitance of the feedback capacitor 631 can be less than a parasitic capacitance (e.g., the first parasitic capacitance 351) at the first amplifier input of the amplifier 320. The feedback capacitor 631 having a lower capacitance than the parasitic capacitance at the first amplifier input of the amplifier 320 can be useful to reduce reset noise (e.g., kTC noise) stored on the feedback capacitor 611 and/or stored on the parasitic capacitance at the first amplifier input of the amplifier 320.

In at least one example, the reset noise stored on the feedback capacitor 611 and/or stored on the parasitic capacitance at the first amplifier input of the amplifier 320 can be controlled using a bandwidth ($\tau_{dmy}$) of the dummy phase. Accordingly, $\tau_{dmy}$ can represent an adjustable parameter for controlling reset noise stored on the feedback capacitor 611 and/or stored on the parasitic capacitance at the first amplifier input of the amplifier 320.

In at least one example, the reset noise stored on the feedback capacitor 611 and on the parasitic capacitance at the first amplifier input of the amplifier 320 can be determined by equation (7):

$$\frac{PSD*(C_{p1}+C_{611})^2}{4*\tau_{dmy}}, \tag{7}$$

where PSD is an input power spectral density of the amplifier 320; $C_{p1}$ is the parasitic capacitance at the first amplifier input of the amplifier 320; and $C_{611}$ is a capacitance of the feedback capacitor 611. In at least one example, a capacitance of the feedback capacitor 631 can be less than a capacitance of the feedback capacitor 611.

A feedback loop 640 can be coupled in parallel with the feedback loop 620 between the second amplifier input of the amplifier 320 and the second amplifier output of the amplifier 320. The feedback loop 640 can include a feedback capacitor 641. The feedback capacitor 641 can be coupled to: the second amplifier input of the amplifier 320 through a switch 643; the second amplifier output of the amplifier 320 through a switch 645; INCM through a switch 647; and OUTCM through a switch 649. In at least one example, the feedback capacitor 641 can generally be in the order of picofarads such as about 1 pF.

In at least one example, a capacitance of the feedback capacitor 641 can be less than a parasitic capacitance (e.g., the second parasitic capacitance 352) at the second amplifier input of the amplifier 320. The feedback capacitor 641 having a lower capacitance than the parasitic capacitance at the second amplifier input of the amplifier 320 can be useful to reduce reset noise (e.g., kTC noise) stored on the feedback capacitor 621 and/or stored on the parasitic capacitance at the second amplifier input of the amplifier 320.

In at least one example, the reset noise stored on the feedback capacitor 621 and/or stored on the parasitic capacitance at the second amplifier input of the amplifier 320 can be controlled using $\tau_{dmy}$ of the dummy phase. Accordingly, $\tau_{dmy}$ can represent an adjustable parameter for controlling reset noise stored on the feedback capacitor 621 and/or stored on the parasitic capacitance at the second amplifier input of the amplifier 320. In at least one example, the reset charge noise stored on the feedback capacitor 621 and on the parasitic capacitance at the second amplifier input of the amplifier 320 can be determined by equation (8):

$$\frac{PSD*(C_{p2}+C_{621})^2}{4*\tau_{dmy}}, \tag{8}$$

where $C_{p2}$ is the parasitic capacitance at the second amplifier input of the amplifier 320 and $C_{621}$ is a capacitance of the feedback capacitor 621. In at least one example, a capacitance of the feedback capacitor 641 can be less than a capacitance of the feedback capacitor 621.

As described above, the conversion phase of the circuit 100 can be partitioned into multiple conversion sub-phases where each conversion sub-phase is specific to a particular channel input of the input 102. The portion of the circuit 100 shown by FIG. 3 implemented an example conversion sub-phase specific to channel input N of the input 102 that included a first phase having an AZ phase and a shorting phase, as described above with respect to FIG. 3 and FIG. 4. The portion of the circuit 100 shown by FIG. 3 lacks a feedback loop (e.g., feedback loops 630 and 640) coupled in parallel with another feedback loop (e.g., feedback loops 610 and 620) between an input and an output of the amplifier 320. The example conversion sub-phase implemented by the portion of the circuit 100 shown by FIG. 3 also included a hold phase that began when the first phase of the example sub-phase ended. That is, the example conversion sub-phase implemented by the portion of the circuit 100 shown by FIG. 3 directly transitioned from the first phase to the hold phase.

An example operation described with respect to FIG. 6 can represent a conversion sub-phase (e.g., $\Phi_{C\_N\_A}$) that is specific to channel input N of the input 102. The conversion sub-phase implemented by the portion of the circuit 100 shown in FIG. 6 can include a first phase having an AZ phase and a shorting phase. The conversion sub-phase implemented by the portion of the circuit 100 shown in FIG. 6 can also include a hold phase. The portion of the circuit 100 shown by FIG. 6 includes feedback loops 630 and 640 that can be useful to implement a dummy phase between the first phase and the hold phase. Implementing a dummy phase in a conversion sub-phase between a first phase and a hold phase can reduce a duration of the first phase. In at least one example, a duration of a first phase implemented by the portion of the circuit 100 shown by FIG. 6 can be about half a duration of a first phase implemented by the portion of the circuit 100 shown by FIG. 3. In at least one example, the dummy phase can intervene between the AZ phase and the hold phase of the conversion sub-phase.

In the AZ phase, the controller 180 can provide A/Z having an asserted value (e.g., a high-voltage value) to control switches (e.g., switches 454 and 458) of the amplifier 320, as described above with respect to FIG. 3 and FIG. 4. Other switches (e.g., the switch 605; switches 612 and 613 of the feedback loop 610; switches 622 and 623 of the feedback loop 620; switches 633, 635, 637, and 639 of the feedback loop 630; and switches 643, 645, 647, and 649 of the feedback loop 640) of the portion of the circuit 100 shown in FIG. 6 can be open in the AZ phase. Responsive to A/Z having the asserted value, the amplifier 320 can operate to sample offset at the first and second amplifier outputs (OUTP and OUTM) of the amplifier. Capacitors (e.g., capacitors 452 and 456) of the amplifier 320 can store charges (e.g., $Q_{AZ\_1}$ and $Q_{AZ\_2}$) related to AZ noise generated by sampling operation of the amplifier 320 in the AZ phase. In at least one example, a magnitude of AZ noise-related charges stored on the capacitors of the amplifier 320 can increase responsive to decreasing a duration of the AZ phase and/or increasing a bandwidth of the AZ phase.

In the shorting phase, the controller 180 can provide SP having an asserted value (e.g., a high-voltage value) to close the switch 605, the switch 613 of the feedback loop 610, and the switch 623 of the feedback loop 620. Closing switch 605 can create an electrical short between the first and second amplifier inputs of the amplifier 320 such that INCM is about ground potential. Closing switch 605 can be useful to reset charges stored by parasitic capacitances (e.g., the first parasitic capacitance 351 and the second parasitic capacitance 352) associated with the first and second amplifier inputs of the amplifier 320 between consecutive hold phases. In at least one example, the switch 605 can represent switches 353 and 354 that are coupled in series between the first and second amplifier inputs of the amplifier 320.

Closing the switch 605 can also couple a first terminal of the feedback capacitor 611 and a first terminal of the feedback capacitor 621 to INCM. Closing the switch 613 can couple a second terminal of the feedback capacitor 611 to REFM. Coupling the first and second terminals of the feedback capacitor 611 to INCM and REFM, respectively, can be useful to reset charge stored in the feedback capacitor 611 between consecutive hold phases. Resetting the charge stored in the feedback capacitor 611 to REFM can introduce reset noise on the feedback capacitor 611 and on a parasitic capacitance (e.g., the first parasitic capacitance 351) at the first amplifier input of the amplifier 320. The reset noise introduced by resetting the feedback capacitor 611 to REFM can be related to a voltage source (e.g., reference generator 170) providing REFM.

Closing the switch 623 can couple a second terminal of the feedback capacitor 621 to REFP. Coupling the first and second terminals of the feedback capacitor 621 to INCM and REFP, respectively, can be useful to reset charge stored in the feedback capacitor 621 between consecutive hold phases. Resetting the charge stored in the feedback capacitor 621 to REFP can introduce reset noise on the feedback capacitor 611 and on a parasitic capacitance (e.g., the second parasitic capacitance 352) at the second amplifier input of the amplifier 320. The reset noise introduced by resetting the feedback capacitor 621 to REFP can be related to a voltage source (e.g., reference generator 170) providing REFP.

In the hold phase, the controller 180 can provide DMY having a deasserted value (e.g., a low-voltage value) to open: the switch 613 of the feedback loop 610; the switch 623 of the feedback loop 620; switches 633 and 635 of the feedback loop 630; and switches 643 and 645 of the feedback loop 640. Opening switches 633 and 635 can be useful to decouple the feedback loop 630 from the first amplifier input and the first amplifier output of the amplifier 320. Opening switches 643 and 645 can be useful to decouple the feedback loop 640 from the second amplifier input and the second amplifier output of the amplifier 320.

In the hold phase, the controller 180 can also provide HOLD having an asserted value (e.g., a high-voltage value) to close: the switch 612 of the feedback loop 610; the switch 622 of the feedback loop 620; switches 637 and 639 of the feedback loop 630; and switches 647 and 649 of the feedback loop 640. Closing the switch 612 can be useful to couple the feedback loop 610 between the first amplifier input and the first amplifier output of the amplifier 320. When the controller 180 provides HOLD having the asserted value, the feedback capacitor 611 can store the AZ noise charge provided by the feedback capacitor 631 during the dummy phase. Parasitic capacitance (e.g., the first parasitic capacitance 351) at the first amplifier input of the amplifier 320 can also store the AZ noise charge provided by the feedback capacitor 631 during the dummy phase. Stated differently, the feedback capacitor 611 and the parasitic capacitance can be precharged to a voltage (e.g. Vn1) controlled using feedback provided by the AZ amplifier 440.

Coupling the feedback loop 610 between the first amplifier input and the first amplifier output of the amplifier 320 with the feedback capacitor 611 and the parasitic capacitance storing the AZ noise charge can be useful to reduce AZ noise charge provided through the feedback capacitor 611 in the hold phase. In at least one example, the AZ noise charge provided through the feedback capacitor 611 in the hold phase can be determined by equation (9):

$$C_{s1}*V_1, \tag{9}$$

where $C_{s1}$ is a capacitance of a sampling capacitor (e.g., the first sampling capacitor 125) coupled to the first amplifier input of the amplifier 320 and $V_1$ is a voltage (e.g., $V_{n1}$) at the first amplifier input. In at least one example, a gain of the AZ noise charge provided through the feedback capacitor 611 in FIG. 6 can be determined by equation (10):

$$C_{s1}/C_{611}, \tag{10}$$

where $C_{611}$ is a capacitance of the feedback capacitor 611.

Closing the switch 622 can be useful to couple the feedback loop 620 between the second amplifier input and the second amplifier output of the amplifier 320. When the controller 180 provides HOLD having the asserted value, the feedback capacitor 621 can store the AZ noise charge provided by the feedback capacitor 640 during the dummy phase. Parasitic capacitance (e.g., the second parasitic capacitance 352) at the second amplifier input of the amplifier 320 can also store the AZ noise charge provided by the feedback capacitor 640 during the dummy phase. Stated differently, the feedback capacitor 621 and the parasitic capacitance can be precharged to a voltage (e.g. $V_{n2}$) controlled using feedback provided by the AZ amplifier 440.

Coupling the feedback loop 620 between the second amplifier input and the second amplifier output of the amplifier 320 with the feedback capacitor 621 and the parasitic capacitance storing the AZ noise charge can be useful to reduce AZ noise charge provided through the feedback capacitor 621 in the hold phase. In at least one example, the AZ noise charge provided through the feedback capacitor 621 in the hold phase can be determined by equation (11):

$$C_{s2}{}^*V_2, \tag{11}$$

where $C_{s2}$ is a capacitance of a sampling capacitor (e.g., the second sampling capacitor 126) coupled to the second amplifier input of the amplifier 320 and $V_2$ is a voltage (e.g., $V_{n2}$) at the second amplifier input. In at least one example, a gain of the AZ noise charge provided through the feedback capacitor 621 in FIG. 6 can be determined by equation (12):

$$C_{s2}/C_{621}, \tag{12}$$

where $C_{621}$ is a capacitance of the feedback capacitor 621.

Closing switches 637 and 639 in the hold phase can be useful to couple the first and second terminals of the feedback capacitor 631 to INCM and OUTCM, respectively. Coupling the first and second terminals of the feedback capacitor 630 to INCM and OUTCM, respectively, can be useful to store an AZ noise charge (e.g., QAZ_1) on the feedback capacitor 631 in the hold phase. The AZ noise charge stored in the feedback capacitor 631 in the hold phase can be provided to the feedback capacitor 611 and the parasitic capacitance at the first amplifier input of the amplifier 320 in a subsequent dummy phase.

Closing switches 647 and 649 in the hold phase can be useful to couple the first and second terminals of the feedback capacitor 641 to INCM and OUTCM, respectively. Coupling the first and second terminals of the feedback capacitor 641 to INCM and OUTCM, respectively, can be useful to store an AZ noise charge (e.g., QAZ_2) on the feedback capacitor 641 in the hold phase. The AZ noise charge stored in the feedback capacitor 641 in the hold phase can be provided to the feedback capacitor 621 and the parasitic capacitance at the second amplifier input of the amplifier 320 in a subsequent dummy phase.

In at least one example, a duration of the dummy phase can be controlled using a capacitance of a compensation capacitor (e.g., compensation capacitors 432 and/or 434) of the amplifier 320. In at least one example, an inverse relationship can exist between a duration of the dummy phase and a duration of the first phase. For example, the duration of the first phase decreases responsive to increasing the duration of the dummy phase or the duration of the first phase increase responsive to decreasing the duration of the dummy phase.

Figure 7:
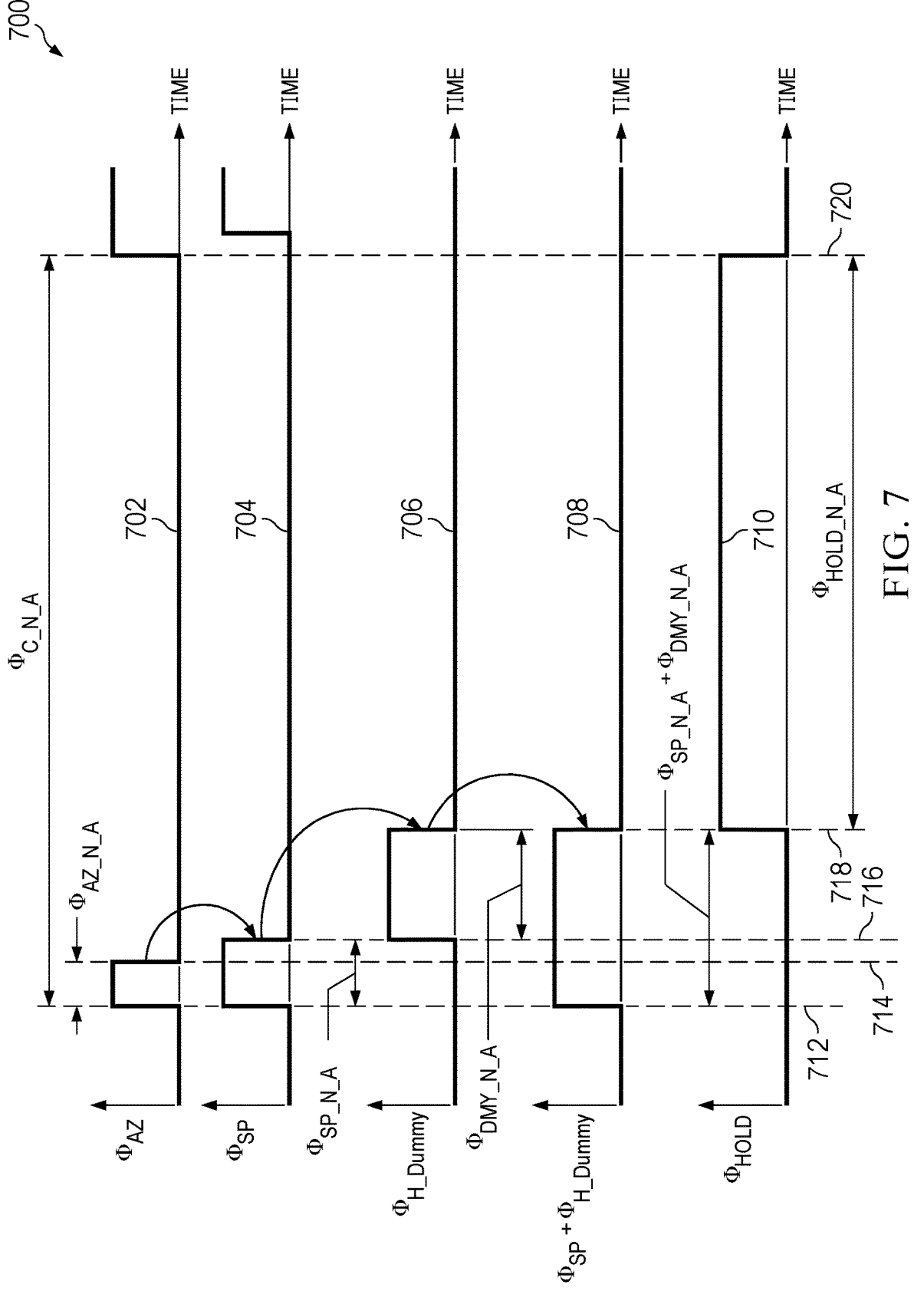
FIG. 7 is a diagram of example waveforms versus time for a circuit for sampling signals.

FIG. 7 is a diagram 700 of example waveforms in the circuit 100 that illustrate conversion sub-phase operation with a dummy phase. The diagram 700 represents different voltages in the circuit 100 as a function of time. The diagram 700 includes waveforms 702, 704, 706, 708, and 710. Waveform 702 represents A/Z provided by the controller

180. Waveform 704 represents SP provided by the controller 180. Waveform 706 represents DMY provided by the controller 180. Waveform 708 represents a summation of SP and DMY provided by the controller 180. Waveform 710 represents HOLD provided by the controller 180.

Waveform 702 has a high-voltage value between time 712 and time 714 that represents the controller 180 providing A/Z having an asserted value. Waveform 704 has a high-voltage value between time 712 and time 716 that represents the controller 180 providing SP having an asserted value. Waveform 706 has a high-voltage value between time 716 and time 718 that represents the controller 180 providing DMY having an asserted value. Waveform 708 has a high-voltage value between time 712 and time 718 that represents the controller 180 providing one or more of SP and DMY having an asserted value. Waveform 710 has a high-voltage value between time 718 and time 720 that represents the controller 180 providing HOLD having an asserted value.

A time period between time 712 and time 720 can correspond to a conversion sub-phase that is specific to a channel input (such as channel input N) of the input 102. The conversion sub-phase that is specific to channel input N of the input 102 is represented in FIG. 7 by $\Phi_{C\_N\_A}$. A time period between time 712 and time 714 can correspond to an AZ phase of the conversion sub-phase that is specific to channel input N of the input 102. The AZ phase of the conversion sub-phase that is specific to channel input N of the input 102 is represented in FIG. 7 by $\Phi_{AZ\_N\_A}$. A time period between time 712 and time 716 can correspond to a shorting phase of the conversion sub-phase that is specific to channel input N of the input 102. The shorting phase of the conversion sub-phase that is specific to channel input N of the input 102 is represented in FIG. 7 by $\Phi_{SP\_N\_A}$.

A time period between time 716 and time 718 can correspond to a dummy phase of the conversion sub-phase that is specific to channel input N of the input 102. The dummy phase of the conversion sub-phase that is specific to channel input N of the input 102 is represented in FIG. 7 by $\Phi_{DMY\_N\_A}$. A time period between time 718 and time 720 can correspond to a hold phase of the conversion sub-phase that is specific to channel input N of the input 102. The hold phase of the conversion sub-phase that is specific to channel input N of the input 102 is represented in FIG. 7 by $\Phi_{HOLD\_N\_A}$.

Various noise reduction benefits were realized by an example implementation of a circuit with an additional feedback loop coupled in parallel with a feedback loop between an input and an output of an amplifier relative to an example implementation of a circuit without the additional feedback loop. The noise values described below are referred to an output of a driver amplifier (e.g., the amplifier 320) for the circuits with the same or substantially similar sampling circuit power dissipation and die area. Output referred reset noise measured at feedback capacitors and parasitic input capacitances from switches (e.g., switches 353, 354, 337, and 339) of the example implementations were 0.66 nanovolts $(nV)^2$ and 2.21 $nV^2$ for the circuits with the additional feedback loop and without the additional feedback loop, respectively. Output referred reset noise measured at feedback capacitors and parasitic input capacitances from a source (e.g., reference generator 170) providing ADC reference voltages of the example implementations were 0.43 $nV^2$ and 0.68 $nV^2$ for the circuits with the additional feedback loop and without the additional feedback loop, respectively. The noise measurements above represent an improvement in output referred reset noise of at least 250 percent.

Output referred AZ phase sampled noise measured at the driver amplifier (e.g., the amplifier 320) of the example implementations were 0.62 $nV^2$ and 1.45 $nV^2$ for the circuits with the additional feedback loop and without the additional feedback loop, respectively. Those noise measurements represent an improvement in output referred AZ phase sampled noise of about 170 percent. Total output referred backend noise measured for the example implementations were 4.55 $nV^2$ and 6.97 $nV^2$ for the circuits with the additional feedback loop and without the additional feedback loop, respectively. Those noise measurements represent an improvement in total output referred backend noise of about 153 percent. Total output referred signal chain noise measured for the example implementations were 4.74 $nV^2$ and 7.15 $nV^2$ for the circuits with the additional feedback loop and without the additional feedback loop, respectively. Those noise measurements represent an improvement in total output referred backend noise of about 150 percent.

Configuring the example implementation without the additional feedback loop to obtain similar noise improvements as the example implementation with the additional feedback loop involved increasing sampling circuit power dissipation in the example implementation without the additional feedback loop from about 1.25 milliwatt (mW) per input channel to about 1.45 mW per input channel, which represents about a 17% increase in sampling circuit power dissipation. Configuring the example implementation without the additional feedback loop to obtain similar noise improvements as the example implementation with the additional feedback loop also involved increasing die area size in the example implementation without the additional feedback loop from about 85 millimeter $(mm)^2$ to about 95 $mm^2$, which represents a die area size increase of about 10 $mm^2$.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While the description above may be specific to a certain channel (such as the channel connected to the channel input N of input 102), the examples contained herein are applicable to all or some of the channels illustrated in FIG. 1.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

What is claimed is:

1. A circuit, comprising:
an amplifier having an amplifier input and an amplifier output;
a first feedback loop that includes a first feedback capacitor and a first switch, wherein: the first feedback loop is coupled between the amplifier input and the amplifier output; and the first feedback capacitor is coupled to the amplifier output through the first switch; and
a second feedback loop that includes a second feedback capacitor and a second switch, wherein the second feedback loop is coupled in parallel with the first feedback loop between the amplifier input and the amplifier output, and the second feedback capacitor is coupled to the amplifier input and to the first feedback capacitor through the second switch, wherein the amplifier includes a differential input that includes the amplifier input, the second feedback loop further includes a third switch having a first terminal and a second terminal, the first terminal of the third switch is coupled between the second switch and the second feedback capacitor, and the second terminal of the third switch is operable to receive a common mode input voltage provided at the differential input.

2. The circuit of claim 1, wherein the amplifier includes a differential output that includes the amplifier output, the second feedback loop further includes a fourth switch having a first terminal and a second terminal, the first terminal of the fourth switch is coupled to the amplifier output through a fifth switch and to the second feedback capacitor, and the second terminal of the fourth switch is operable to receive a common mode output voltage provided at the differential output.

3. The circuit of claim 1, wherein the second feedback loop further includes a fourth switch that is coupled between the second feedback capacitor and the amplifier output.

4. A circuit, comprising:
an amplifier having an amplifier input and an amplifier output;
a first feedback loop that includes a first feedback capacitor and a first switch, wherein: the first feedback loop is coupled between the amplifier input and the amplifier output; and the first feedback capacitor is coupled to the amplifier output through the first switch; and
a second feedback loop that includes a second feedback capacitor and a second switch, wherein the second feedback loop is coupled in parallel with the first feedback loop between the amplifier input and the amplifier output, and the second feedback capacitor is coupled to the amplifier input and to the first feedback capacitor through the second switch, wherein the first feedback loop further includes a third switch having a first terminal and a second terminal, the first terminal of the third switch is coupled between the first feedback capacitor and the first switch, the second terminal of the third switch is operable to receive a reference voltage provided at an analog-to-digital converter, and the second feedback capacitor is coupled to the third switch through the second switch and the first feedback capacitor.

5. A circuit, comprising:
an amplifier having an amplifier input and an amplifier output;
a first feedback loop that includes a first feedback capacitor and a first switch, wherein: the first feedback loop is coupled between the amplifier input and the amplifier output; and the first feedback capacitor is coupled to the amplifier output through the first switch; and
a second feedback loop that includes a second feedback capacitor and a second switch, wherein the second feedback loop is coupled in parallel with the first feedback loop between the amplifier input and the amplifier output, and the second feedback capacitor is coupled to the amplifier input and to the first feedback capacitor through the second switch, wherein a capacitance of the second feedback capacitor is less than a parasitic capacitance at the amplifier input or less than a capacitance of the first feedback capacitor.

6. The circuit of claim 5, wherein the amplifier includes a differential input that includes the amplifier input, the second feedback loop further includes a third switch having a first terminal and a second terminal, the first terminal of the third switch is coupled between the second switch and the second feedback capacitor, and the second terminal of the third switch is operable to receive a common mode input voltage provided at the differential input.

7. The circuit of claim 6, wherein a capacitance of the second feedback capacitor is less than a capacitance of the first feedback capacitor.

8. A circuit, comprising:
an amplifier having an amplifier input and an amplifier output;
a first feedback loop that includes a first feedback capacitor and a first switch, wherein: the first feedback loop is coupled between the amplifier input and the amplifier output; and the first feedback capacitor is coupled to the amplifier output through the first switch; and
a second feedback loop that includes a second feedback capacitor and a second switch, wherein the second feedback loop is coupled in parallel with the first feedback loop between the amplifier input and the amplifier output, and the second feedback capacitor is coupled to the amplifier input and to the first feedback capacitor through the second switch, wherein the amplifier input is coupled to an integrator and the amplifier output is coupled to an analog-to-digital converter.

9. A circuit, comprising:
an amplifier having an amplifier input and an amplifier output, wherein the circuit is configured to operate in an auto-zero (AZ) phase, a hold phase, and a dummy phase that intervenes between the AZ phase and the hold phase;
a first feedback loop coupled between the amplifier input and the amplifier output, wherein the first feedback loop includes a first feedback capacitor that is coupled to the amplifier output through a first switch; and
a second feedback loop that is coupled in parallel with the first feedback loop between the amplifier input and the amplifier output, wherein the second feedback loop includes a second feedback capacitor that is coupled to the amplifier input and to the first feedback capacitor through a second switch.

10. The circuit of claim 9, wherein the second switch is configured to couple the second feedback capacitor to the first feedback capacitor and to a parasitic capacitance at the amplifier input during the dummy phase.

11. The circuit of claim 9, wherein the amplifier includes a differential input that includes the amplifier input, the second feedback loop further includes a third switch coupled between the second switch and the second feedback capacitor, and the third switch is configured to couple the second feedback capacitor to a common mode input voltage provided at the differential input during the hold phase.

12. The circuit of claim 9, wherein the amplifier includes a differential output that includes the amplifier output, the second switch is coupled to a first terminal of the second feedback capacitor, the second feedback loop further includes a fourth switch that is coupled to a second terminal of the second feedback capacitor; and the fourth switch is configured to couple the second terminal of the second feedback capacitor to a common mode output voltage provided at the differential output during the hold phase.

13. The circuit of claim 9, wherein the amplifier includes a compensation capacitor that is coupled to the amplifier output; the second feedback loop further includes a fifth switch that is coupled between the second feedback capacitor and the amplifier output; and the fifth switch is configured to couple the second feedback capacitor to the compensation capacitor through the amplifier output during the dummy phase.

14. The circuit of claim 9, wherein the first feedback loop further includes a sixth switch that is coupled between the first feedback capacitor and the first switch, the amplifier output is coupled to an analog-to-digital converter, and the sixth switch is configured to couple the first feedback capacitor to a reference voltage provided at the analog-to-digital converter during the dummy phase.

15. The circuit of claim 9, wherein the amplifier input is a first amplifier input, the amplifier includes a differential input that includes the first amplifier input and a second amplifier input, and the circuit further comprises:

a third feedback loop that includes a seventh switch and a third feedback capacitor, wherein the seventh switch is configured to couple the third feedback capacitor to the second amplifier input during the dummy phase.

16. A circuit configured to operate in an auto-zero (AZ) phase, a hold phase, and a dummy phase that intervenes between the AZ phase and the hold phase, the circuit comprising:

an amplifier having an amplifier input and an amplifier output, wherein the amplifier input is coupled to an integrator, and wherein the amplifier output is coupled to an analog-to-digital converter;

a first feedback loop coupled between the amplifier input and the amplifier output, wherein the first feedback loop includes a first feedback capacitor that is coupled to the amplifier output through a first switch; and a second feedback loop that is coupled in parallel with the first feedback loop between the amplifier input and the amplifier output, wherein the second feedback loop includes a second feedback capacitor, a second switch, and a third switch;

wherein the second feedback capacitor is coupled to the amplifier input and the first feedback capacitor through the second switch, and wherein the second feedback capacitor is coupled to the amplifier output through the third switch.

17. The circuit of claim 16, wherein the second switch is configured to couple the second feedback capacitor to the first feedback capacitor and to a parasitic capacitance at the amplifier input during the dummy phase, and the third switch is configured to couple the second feedback capacitor to a compensation capacitor of the amplifier through the amplifier output during the dummy phase.

18. The circuit of claim 16, wherein the second feedback loop further includes a fourth switch and a fifth switch, the fourth switch is configured to couple a first terminal of the second feedback capacitor to a common mode input voltage of the amplifier during the hold phase, and the fifth switch is configured to couple a second terminal of the second feedback capacitor to a common mode output voltage of the amplifier during the hold phase.

19. The circuit of claim 16, wherein an inverse relationship exists between a duration of the AZ phase and a duration of the dummy phase.

20. The circuit of claim 16, wherein the first feedback loop further includes a sixth switch coupled to a first terminal of the first feedback capacitor, the sixth switch is configured to couple the first terminal of the first feedback capacitor to a reference voltage provided at the analog-to-digital converter during the dummy phase, and the second switch is configured to couple the second feedback capacitor to a second terminal of the first feedback capacitor during the dummy phase.

21. The circuit of claim 6, wherein a capacitance of the second feedback capacitor is less than a parasitic capacitance at the amplifier input.

* * * * *